(12) United States Patent
Anthony et al.

(10) Patent No.: US 6,995,983 B1
(45) Date of Patent: Feb. 7, 2006

(54) COMPONENT CARRIER

(75) Inventors: Anthony A. Anthony, Erie, PA (US); William M. Anthony, Erie, PA (US)

(73) Assignee: X2Y Attenuators, LLC, Santa Monica, CA (US)

(*) Notice: Subject to any disclaimer, the term of this patent is extended or adjusted under 35 U.S.C. 154(b) by 0 days.

(21) Appl. No.: 09/647,648

(22) PCT Filed: Apr. 6, 1999

(86) PCT No.: PCT/US99/07653

§ 371 (c)(1),
(2), (4) Date: Nov. 17, 2000

Related U.S. Application Data

(63) Continuation-in-part of application No. 09/056,436, filed on Apr. 7, 1998, now abandoned, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,305.

(60) Provisional application No. 60/101,511, filed on Sep. 23, 1998, and provisional application No. 60/103,759, filed on Oct. 9, 1998.

(51) Int. Cl.
*H05K 7/10* (2006.01)

(52) U.S. Cl. ....................... 361/760; 361/113
(58) Field of Classification Search ............. 174/261, 174/262–266; 361/760, 763, 766, 56, 58, 361/111, 113, 118
See application file for complete search history.

(56) References Cited

U.S. PATENT DOCUMENTS

| 3,790,858 A | 2/1974 | Brancaleone et al. |
| 3,842,374 A | 10/1974 | Schlicke |
| 4,139,783 A | 2/1979 | Engeler |
| 4,262,317 A | 4/1981 | Baumbach |

(Continued)

FOREIGN PATENT DOCUMENTS

| DE | 198 57 043 C1 | 3/2000 |
| JP | 3-18112 | 1/1991 |
| JP | 6-53048 | 2/1994 |
| JP | 6-53049 | 2/1994 |

(Continued)

OTHER PUBLICATIONS

PCT International Search Report for International Application No. PCT/US98/06962 Aug. 19, 1998.
PCT International Search Report for International Application No. PCT/US99/01040 Apr. 19, 1999.

(Continued)

*Primary Examiner*—David L. Talbott
*Assistant Examiner*—Jeremy Norris
(74) *Attorney, Agent, or Firm*—Hahn Loeser & Parks, LLP; Robert J. Clark

(57) ABSTRACT

The present invention is a component carrier comprising a plate of insulating material having a plurality of apertures for accepting the leads of a thru-hole differential and common mode filter. Another embodiment comprises a surface mount component carrier comprised of a disk of insulating material having a plurality of apertures. The same concept for the above described carrier is also incorporated into several alternate embodiments, either independently or embedded within electronic connectors, or configured for use with electric motors. The overall configuration and electrical characteristics of the concepts underlying the present inventions are also described as an electrical circuit conditioning assembly which encompasses the combination of differential and common mode filters and component carriers optimized for such filters. The various embodiments of component carriers provide increased physical support and protection to differential and common mode filters and substantially improve the electrical characteristics of the filters due to the increased shielding provided by the carriers.

48 Claims, 25 Drawing Sheets

U.S. PATENT DOCUMENTS

| | | | |
|---|---|---|---|
| 4,335,417 | A | 6/1982 | Sakshaug et al. |
| 4,688,151 | A | 8/1987 | Kraus et al. |
| 4,772,225 | A | 9/1988 | Ulery |
| 4,789,847 | A | 12/1988 | Sakamoto et al. |
| 4,814,295 | A | 3/1989 | Mehta |
| 4,967,315 | A | 10/1990 | Schelhorn |
| 5,059,140 | A | 10/1991 | Philippson et al. |
| 5,065,284 | A | 11/1991 | Hernandez |
| 5,140,497 | A | 8/1992 | Kato et al. |
| 5,142,430 | A | 8/1992 | Anthony |
| 5,186,647 | A | 2/1993 | Denkmann et al. |
| 5,243,308 | A | 9/1993 | Shusterman et al. |
| 5,299,956 | A | 4/1994 | Brownell et al. |
| 5,310,363 | A | 5/1994 | Brownell et al. |
| 5,311,408 | A | 5/1994 | Ferchau et al. |
| 5,321,373 | A | 6/1994 | Shusterman et al. |
| 5,321,573 | A | 6/1994 | Person et al. |
| 5,326,284 | A | 7/1994 | Bohbot et al. |
| 5,337,028 | A | 8/1994 | White |
| 5,353,202 | A | 10/1994 | Ansell et al. |
| 5,362,249 | A | 11/1994 | Carter |
| 5,362,254 | A | 11/1994 | Siemon et al. |
| 5,396,201 | A | 3/1995 | Ishizaki et al. |
| 5,414,393 | A | 5/1995 | Rose et al. |
| 5,432,484 | A | 7/1995 | Klas et al. |
| 5,446,625 | A | 8/1995 | Urbish et al. |
| RE35,064 | E | 10/1995 | Hernandez |
| 5,477,933 | A | 12/1995 | Nguyen |
| 5,500,785 | A | 3/1996 | Funada |
| 5,512,196 | A | 4/1996 | Mantese et al. |
| 5,535,101 | A | 7/1996 | Miles et al. |
| 5,555,150 | A | 9/1996 | Newman, Jr. |
| 5,586,007 | A | 12/1996 | Funada |
| 5,592,391 | A | 1/1997 | Muyshondt et al. |
| 5,640,048 | A | 6/1997 | Selna |
| 5,700,167 | A | 12/1997 | Pharney et al. |
| 5,767,446 | A | 6/1998 | Ha et al. |
| 5,797,770 | A | 8/1998 | Davis et al. |
| 5,808,873 | A | 9/1998 | Celaya et al. |
| 5,825,628 | A | 10/1998 | Garbelli et al. |
| 5,828,093 | A | 10/1998 | Naito et al. |
| 5,838,216 | A | 11/1998 | White et al. |
| 5,880,925 | A | 3/1999 | DuPre et al. |
| 5,889,445 | A | 3/1999 | Ritter et al. |
| 5,909,350 | A | 6/1999 | Anthony |
| 6,018,448 | A | 1/2000 | Anthony |
| 6,034,864 | A | 3/2000 | Naito et al. |
| 6,038,121 | A | 3/2000 | Naito et al. |
| 6,072,687 | A | 6/2000 | Naito et al. |
| 6,097,581 | A | 8/2000 | Anthony |
| 6,157,528 | A * | 12/2000 | Anthony .................... 361/106 |
| 6,282,074 | B1 * | 8/2001 | Anthony .................... 361/106 |

FOREIGN PATENT DOCUMENTS

| | | |
|---|---|---|
| JP | 6-53075 | 2/1994 |
| JP | 6-53077 | 2/1994 |
| JP | 6-53078 | 2/1994 |
| JP | 6-84695 | 3/1994 |
| JP | 6-151014 | 5/1994 |
| JP | 6-151244 | 5/1994 |
| JP | 6-151245 | 5/1994 |
| JP | 6-325977 | 11/1994 |
| JP | 7-235406 | 9/1995 |
| JP | 7-235852 | 9/1995 |
| JP | 7-240651 | 9/1995 |
| JP | 8-124795 | 5/1996 |
| JP | 8-172025 | 7/1996 |
| JP | 11-214256 | 8/1999 |
| WO | WO 00/16446 | 3/2000 |

OTHER PUBLICATIONS

PCT International Search Report for International Application No. PCT/US99/07653 Jul. 19, 1999.

PCT International Serach Report for International Application No. PCT/US00/11409 Sep. 18, 2000.

PCT International Search Report for International Application No. PCT/US00/14626 Sep. 13, 2000.

PCT International Search Report for International Application No. PCT/US00/16518 Nov. 8, 2000.

* cited by examiner

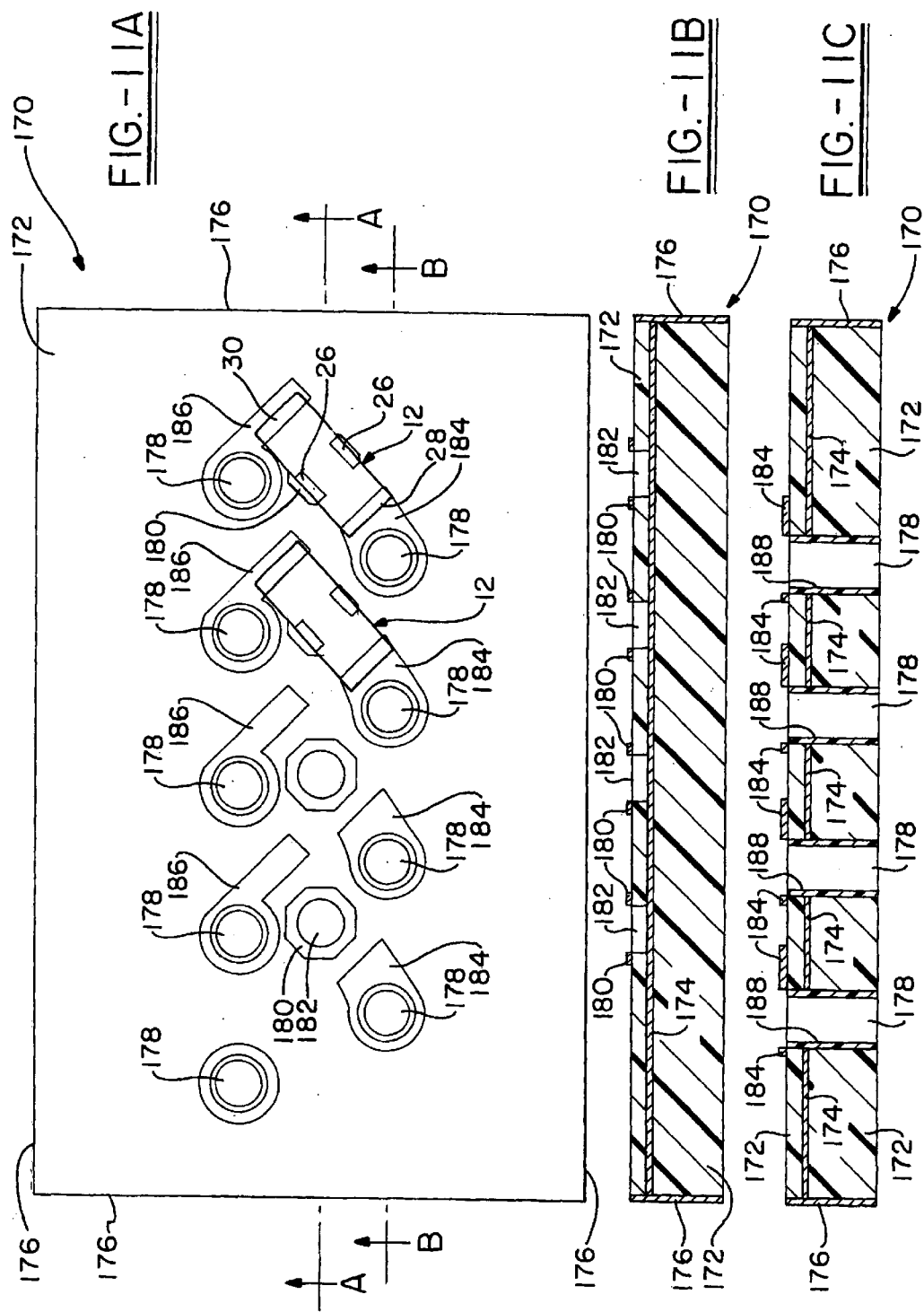

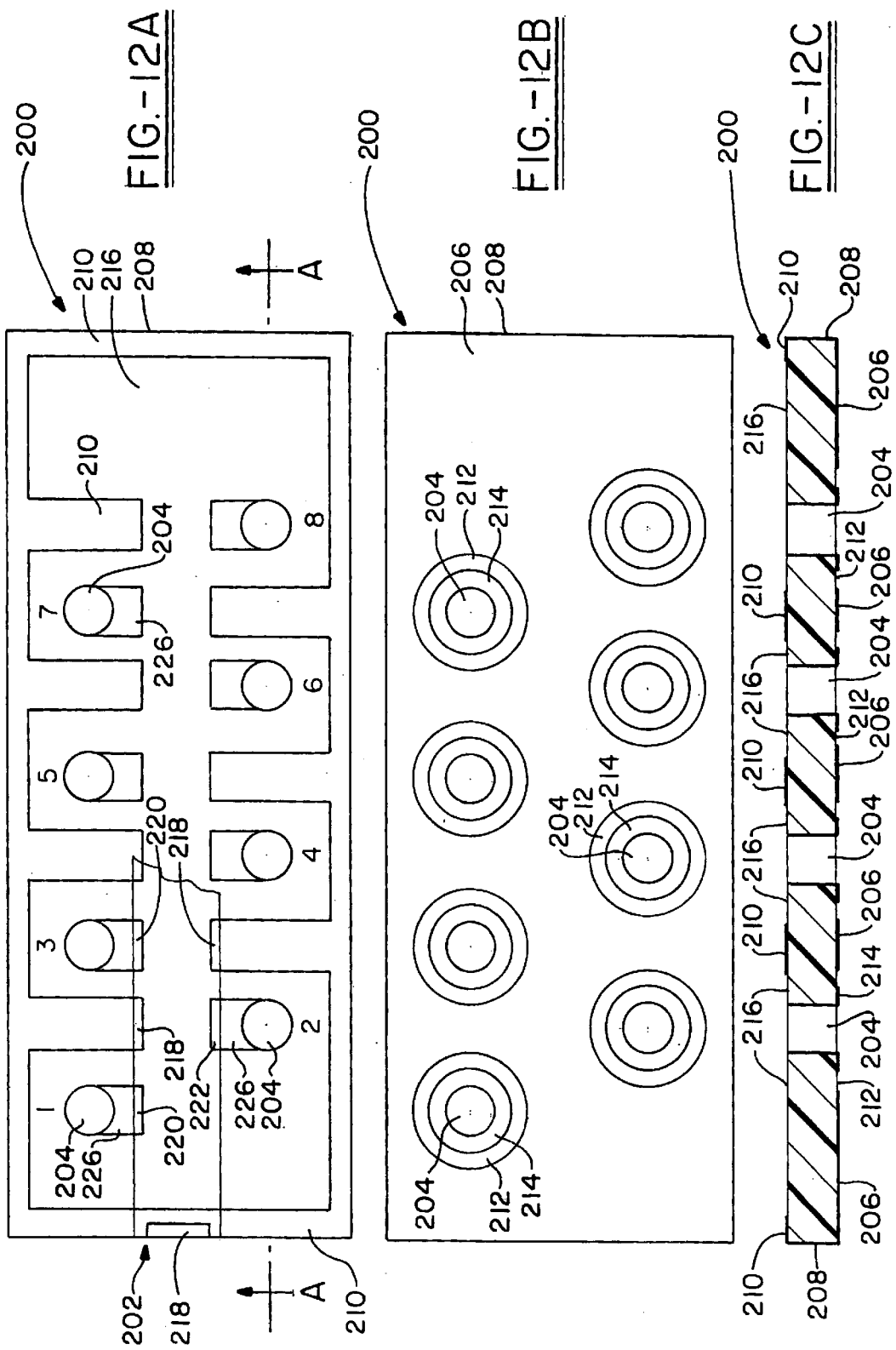

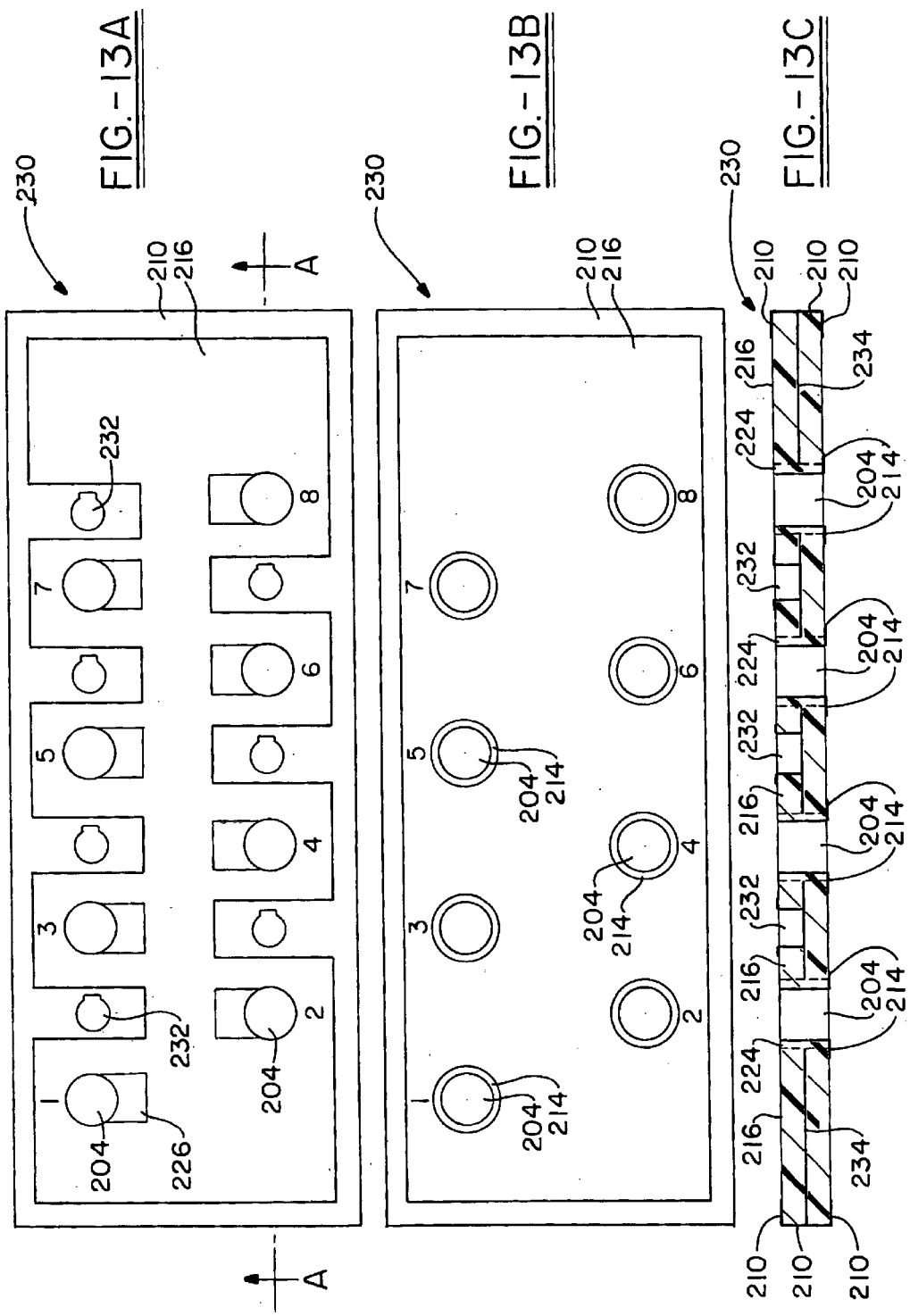

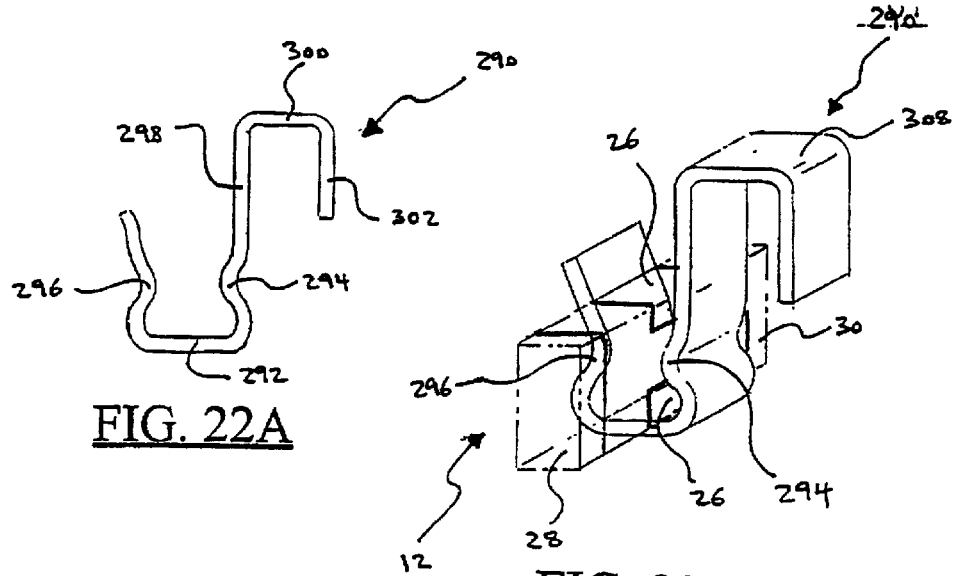
FIG. 22A
FIG. 22B
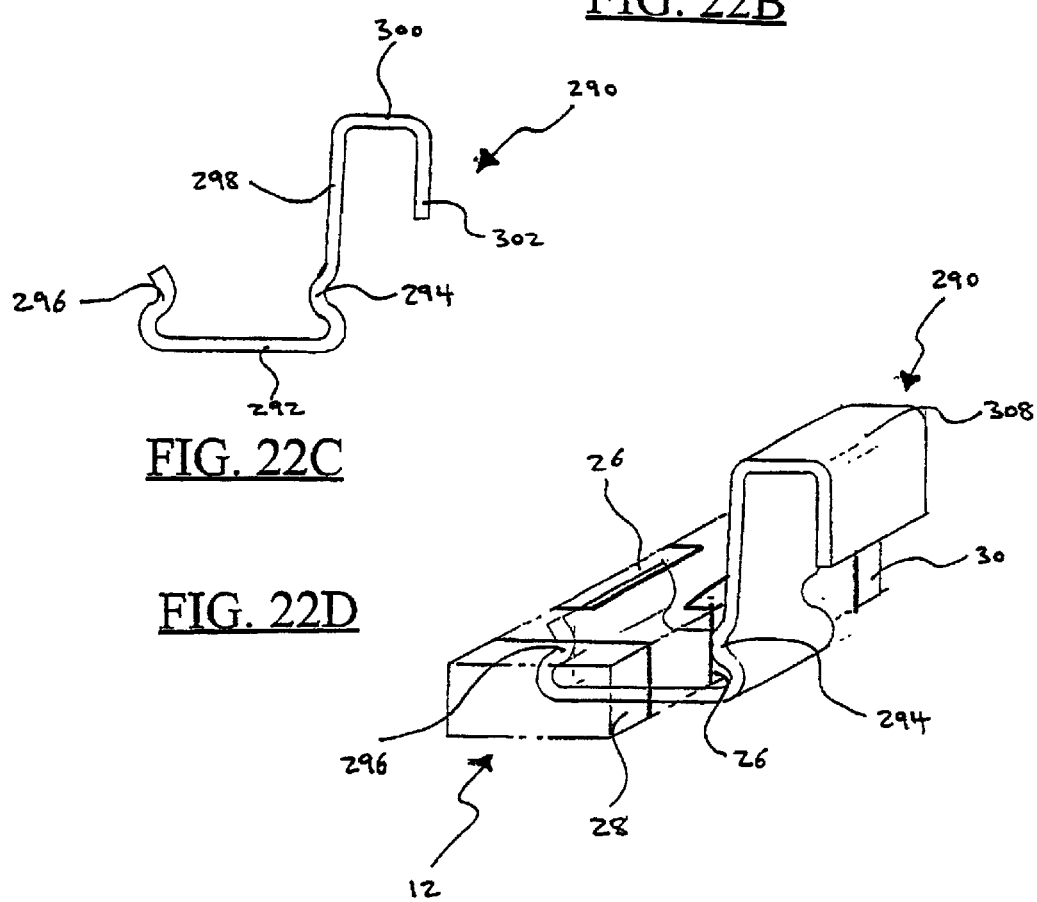
FIG. 22C
FIG. 22D

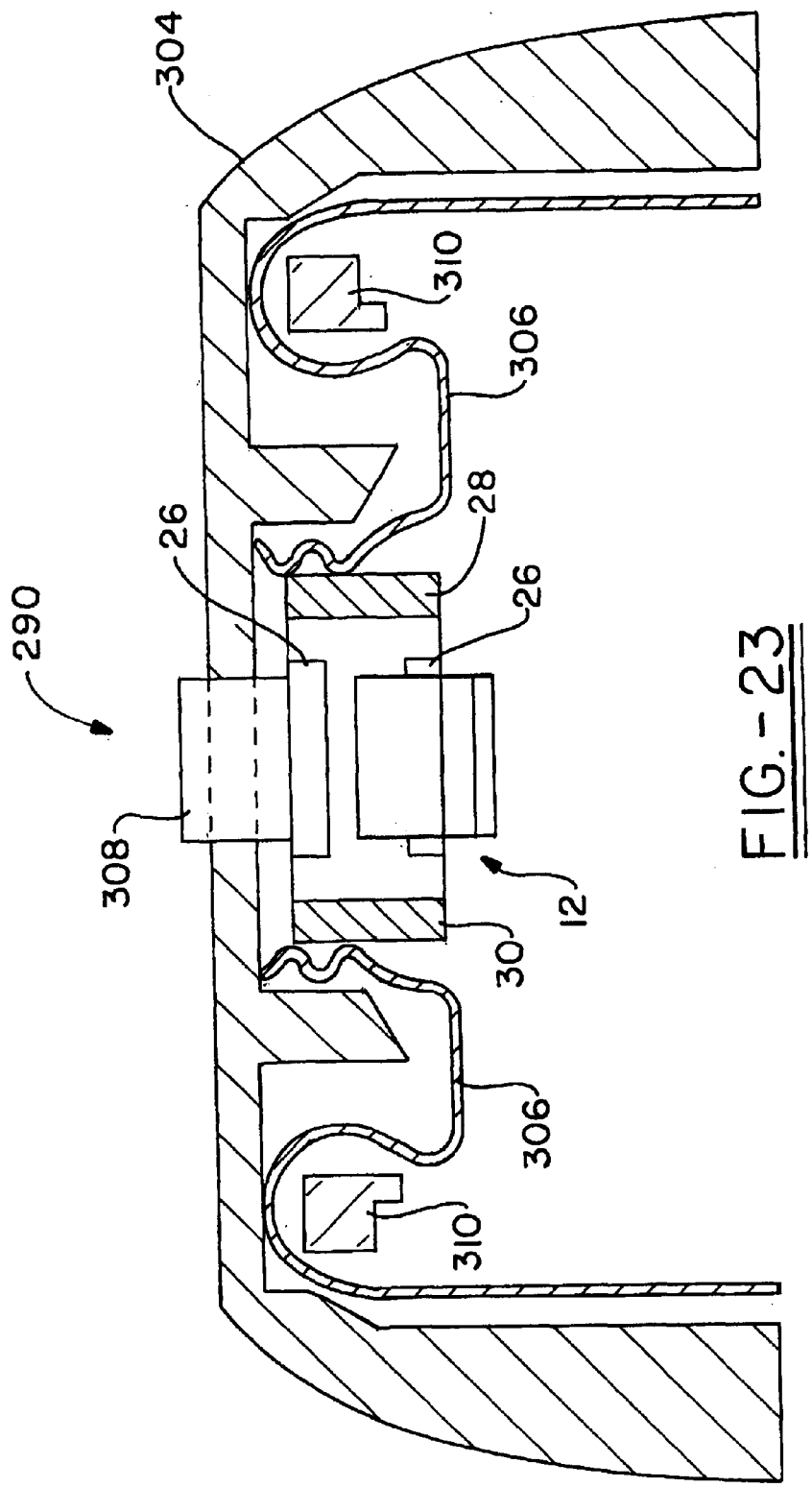

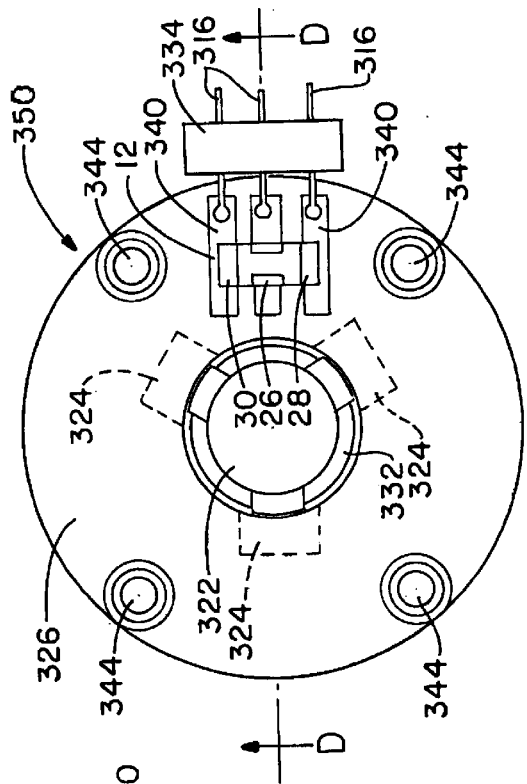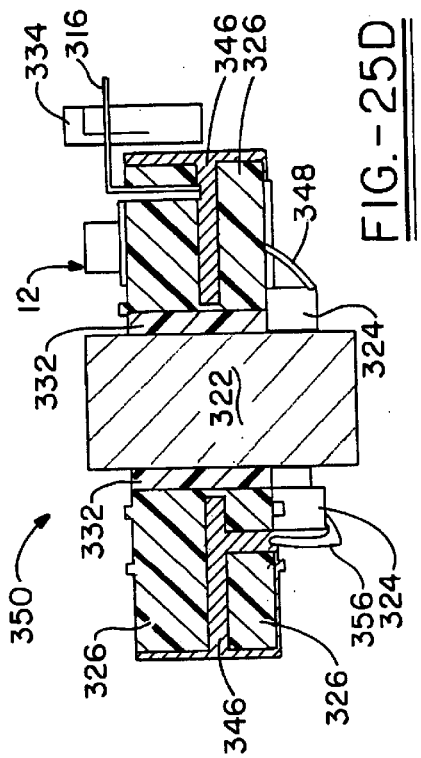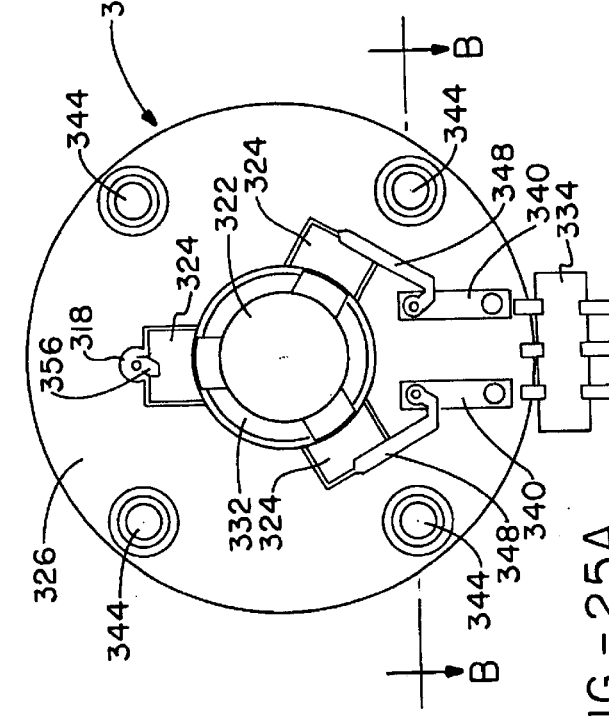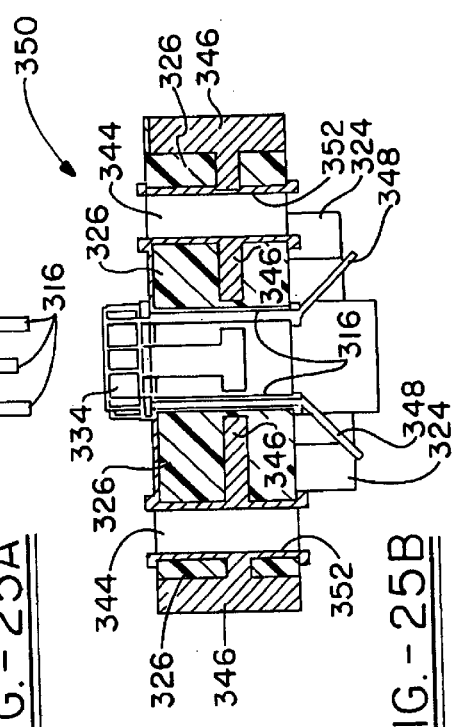

COMPONENT CARRIER

TECHNICAL FIELD

This application is a national stage application of international application PCT/US99/07653 filed Apr. 6, 1999. This application is a continuation-in-part of application Ser. No. 09/056,436 filed Apr. 7, 1998, now abandoned, which is a continuation-in-part of U.S. application Ser. No. 09/008,769 filed Jan. 19, 1998, now U.S. Pat. No. 6,097,581 which is a continuation-in-part of U.S. application Ser. No. 08/841,940, filed Apr. 8, 1997, now U.S. Pat. No. 5,909,305. This application also claims the benefit of U.S. Provisional Application No. 60/101,511 filed Sep. 23, 1998 and U.S. Provisional Application No. 60/103,759 filed Oct. 9, 1998. The present invention relates to electronic component carriers used in the manufacture of electronic equipment. More specifically, the invention relates to component carrier substrates used to protect electronic components from mechanical stresses associated with their handling and coupling within electronic equipment. The component carrier substrates also provide electrical interference shielding and improved thermal characteristics.

BACKGROUND OF THE INVENTION

The majority of electronic equipment produced presently, and in particular computers, communication systems, military surveillance equipment, stereo and home entertainment equipment, televisions and other appliances include miniaturized components to perform new high speed functions and electrical interconnections which according to the materials from which they are made or their mere size are very susceptible to stray electrical energy created by electromagnetic interference or voltage transients occurring on electrical lines. Voltage transients can severely damage or destroy such micro-electronic components or contacts thereby rendering the electronic equipment inoperative, and requiring extensive repair and/or replacement at great cost.

Based upon the foregoing there was found a need to provide a multi-functioning electronic component architecture which attenuates electromagnetic emissions resulting from differential and common mode currents flowing within electronic circuits, single lines, pairs of lines and multiple twisted pairs. Such multi-functioning electronic components are the subject of application Ser. No. 08/841,940, continuation-in-part application Ser. No. 09/008,769, and continuation-in-part application Ser. No. 09/056,379, all incorporated herein by reference.

While the above referenced electronic components accomplish their respective tasks, usage of such components has been limited for a number of reasons. First, the number of such components required continues to increase as applications, such as data buses, continue to grow. In addition, as the number of required components grows, so does the physical size of multi-component packages. Second, by their nature the electronic components referred to are delicate structures which do not handle physical stress well. During the manufacture of electronic products a number of mechanical stresses associated with handling and soldering can damage the components.

Another drawback to using the referenced electronic components is that it becomes very tedious to manually handle and mount the components on electronic products being assembled. This often time translates into lower product yields and added expense due to broken or misconnected components. A further disadvantage to some of the components is that they include leads for thru-hole insertion. Physical stressing, bending or applying torque to the leads can cause a failure in the final product, either immediately or later thereby affecting the products overall reliability.

Another source of electrical noise found in prior art differential mode filters, common mode filters and capacitor decouplers is caused by imperfections in the capacitors that make up the filters and decouplers. The effects of these imperfections are commonly referred to as parasitic effects. Parasitic or non-ideal capacitor behavior manifests itself in the form of resistive and inductive elements, nonlinearity and dielectric memory. The four most common effects are leakage or parallel resistance, equivalent series resistance (ESR), equivalent series inductance (ESL) and dielectric absorption. The equivalent series resistance (ESR) of a capacitor is the resistance of the capacitor leads in series with the equivalent resistance of the capacitor plates. ESR causes the capacitor to dissipate power during high flowing ac currents. The equivalent series inductance (ESL) of a capacitor is the inductance of the capacitor leads in series with the equivalent inductance of the capacitor plates. An additional form of parasitic that goes beyond the component itself is stray capacitance which is attributed to the attachment of the capacitor element within an electrical circuit. Stray capacitors are formed when two conductors are in close proximity to each other and are not shorted together or screened by a Faraday shield. Stray capacitance usually occurs between parallel traces on a PC board or between traces/planes on opposite sides of a PC board. Stray capacitance can cause problems such as increased noise and decreased frequency response.

Several other sources of electrical noise include cross talk and ground bounce. Cross talk in most connectors or carriers is usually the result of mutual inductance between two adjacent lines rather than from parasitic capacitance and occurs when signal currents follow the path of least inductance, especially at high frequencies, and return or couple onto nearby conductors such as conductive tracks positioned parallel with or underneath the signal current track. Ground bounce is caused by shifts in the internal ground reference voltage due to output switching of a component. Ground bounce causes false signals in logic inputs when a device output switches from one state to another. It has been found that the multi-functioning electronic components, specifically the differential and common mode filters and decouplers disclosed in the above referenced, commonly owned U.S. patent applications, provide improved performance when coupled or used with an enlarged ground shield that can substantially decrease or reduce and in some cases can eliminate capacitor parasitics, stray capacitance, mutual inductive coupling between two opposing conductors, various forms of cross talk and ground bounce.

Therefore, in light of the foregoing deficiencies in the prior art, the applicant's invention is herein presented.

SUMMARY OF THE INVENTION

Based upon the foregoing, there has been found a need to provide a component carrier which is less susceptible to mechanical stresses and shock, more easily assembled, surface mountable and capable of being used in automated assembly.

It is therefore a main object of the present invention to provide a component carrier for maintaining one or more surface mount components.

It is another object of the present invention to provide a component carrier which is less susceptible to mechanical stresses imparted upon components during various manufacturing processes.

It is also an object of the present invention to provide a component carrier having an enhanced ground surface which improves the functional characteristics of surface mount components coupled to the component carrier.

It is a further object of the present invention to provide a component carrier adapted specifically to receive a differential and common mode filter and decoupler as disclosed in the above referenced, commonly owned pending U.S. patent applications.

It is a further object of the present invention to provide a component carrier having an enhanced ground surface which improves the functional characteristics of differential and common mode filters and decouplers as disclosed in the above referenced, commonly owned pending U.S. patent applications.

It is a further object of the present invention to provide an electrical circuit conditioning assembly that combines a component carrier with a differential and common mode filter and decoupler as disclosed in the above referenced, commonly owned pending U.S. patent applications to thereby provide simultaneous filtering of common and differential mode interference, suppression of parasitic or stray capacitance, mutual inductive coupling between two adjacent conductors and circuit decoupling from a single assembly.

These and other objects and advantages of the present invention are accomplished through the use of various embodiments of a component carrier which receives either a thru-hole or surface mount differential and common mode filter and decoupler as disclosed in the above referenced, commonly owned pending U.S. patent applications (hereinafter referred to only as "differential and common mode filter").

One embodiment consists of a plate of insulating material, also referred to as a planar insulator, having a plurality of apertures for accepting the leads of a thru-hole differential and common mode filter. Another embodiment consists of a surface mount component carrier comprised of a disk of insulating material having at least two apertures. The disk is substantially covered by a metalized ground surface and includes at least two conductive pads surrounding the apertures, and insulating bands which surround each conductive pad. The insulating bands separate and electrically isolate the conductive pads from the metalized ground surface. A surface mount component, such as a differential and common mode filter, is positioned lengthwise between the two conductive pads and operably coupled to the carrier. Once the surface mount component is coupled to the carrier, the combination can be manipulated, either manually or through various types of automated equipment, without subjecting the surface mount component to mechanical and physical stresses normally associated with the handling of miniature components. The carrier also provides the added benefit of improved shielding from electromagnetic interference and over voltage dissipation due to the surface area of the metalized ground surface.

The same concept for the above described carrier is also incorporated into several alternate embodiments, either independently, embedded within electronic connectors or configured for use with electric motors. The overall configuration and electrical characteristics of the concepts underlying the present inventions are also described as an electrical circuit conditioning assembly which encompasses the combination of differential and common mode filters and component carriers optimized for such filters.

These along with other objects and advantages of the present invention will become more readily apparent from a reading of the detailed description taken in conjunction with the drawings and the claims.

BRIEF DESCRIPTION OF THE DRAWINGS

FIG. 11A is a top plan view of a multi surface mount component carrier with and without differential and common mode filters coupled to the component carrier, wherein the component carrier is optimized for use in a D-sub connector assembly; FIG. 11B is an elevational view in cross section of the component carrier along lines A—A; and FIG. 11C is an elevational view in cross section of the component carrier along lines B—B;

FIG. 12A is a top plan view of a surface mount component carrier with a strip differential and common mode filter partially shown coupled to the component carrier, wherein the component carrier is optimized for use in an RJ-45 connector assembly; FIG. 12B is a bottom plan view of the component carrier shown in FIG. 12A; and FIG. 12C is an elevational view in cross section of the component carrier shown in FIG. 12A along lines A—A;

FIG. 13A is a top plan view of an alternate surface mount component carrier, wherein the component carrier is optimized for use in an RJ-45 connector assembly; FIG. 13B is a bottom plan view of the component carrier shown in FIG. 13A; and FIG. 13C is an elevational view in cross section of the component carrier shown in FIG. 13A along lines A—A;

FIG. 22A is a side elevational view of a ground strap carrier of the present invention; FIG. 22B is a perspective view of the ground strap carrier including a differential and common mode filter; FIG. 22C is a side elevational view of an alternate embodiment of the ground strap carrier of the present invention; and FIG. 22D is a perspective view of the ground strap carrier shown in FIG. 22C including a differential and common mode filter, FIG. 23 is a side elevational view in cross section of the ground strap carrier shown in FIGS. 22A–D in operable coupling with an electric motor;

FIG. 25A is a bottom plan view of an alternate embodiment of the motor filter carrier of the present invention; FIG. 25B is a side elevational view in cross section of the motor filter carrier shown in FIG. 25A along lines B—B; FIG. 25C is a top plan view of the motor filter carrier shown in FIGS. 25A and 25B; and FIG. 25D is a side elevational view in cross section of the motor filter carrier shown in FIG. 25C along lines A–A;

DETAILED DESCRIPTION OF THE PREFERRED EMBODIMENTS

Figure 1:
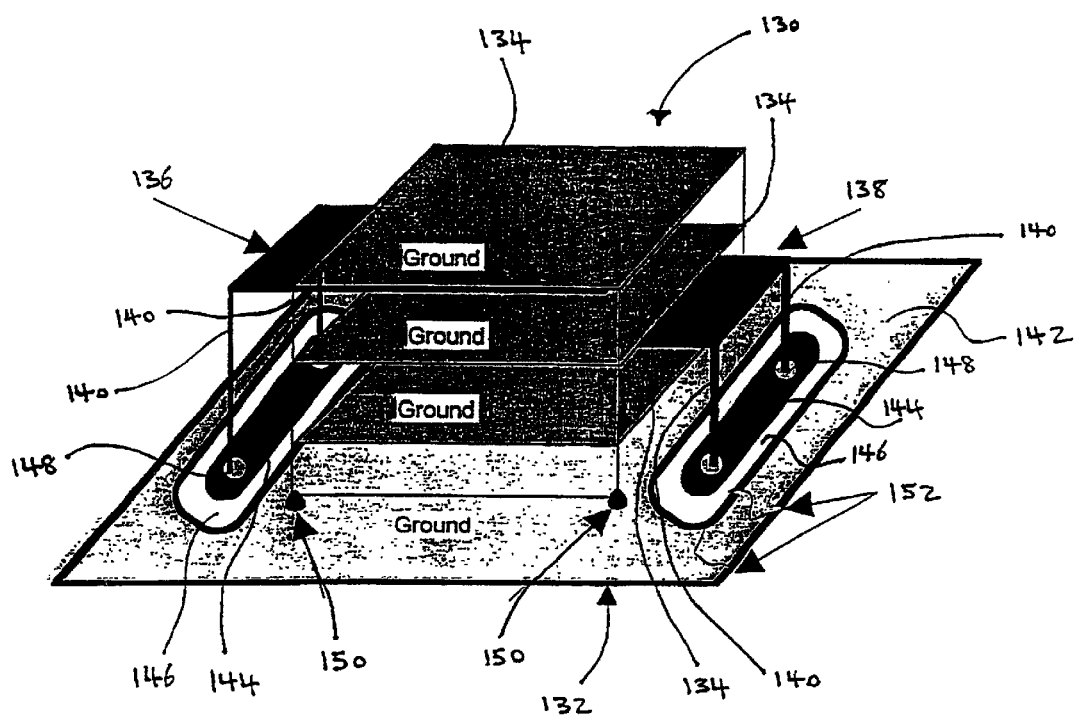
FIG. 1 is a perspective, exploded view of a thru-hole differential and common mode filter coupled to a portion of the thru-hole component carrier of the present invention.

FIG. 1 shows the present invention in its simplest form. Component carrier 132 is shown coupled with a differential and common mode filter 130 having thru-hole leads 140 for electrical coupling to carrier 132. Differential and common mode filter 130 is disclosed in application Ser. Nos. 08/841,940; 09/008,769; and 09/056,379, incorporated herein by reference. Briefly, the structure of differential and common mode filter 130 will be described. Filter 130 consists of a first electrode 136 and a second electrode 138 which are separated by and electrically isolated from a plurality of ground layers 134 and each other. The particular architecture creates a line-to-line capacitor and two line-to-ground capacitors which provide for differential and common mode filtering and decoupling.

Because filter 130 is a somewhat fragile component, component carrier 132 provides a physical support to which filter 130 is electrically coupled. The first and second electrodes 136 and 138 each have conductive leads 140 which are inserted into apertures 148 of conductive pads 144. Each conductive pad 144 is electrically isolated from the conductive surface 142 of component carrier 132 by insulating bands 146. Not only does component carrier 132 provide additional physical strength to differential and common mode filter 130 but it also acts as a ground shield which substantially improves the electrical characteristics of filter 130. When filter 130 is properly coupled to carrier 132 the plurality of ground layers 134 are electrically coupled to one another and then coupled to conductive surface 142 by any number of means known by those of ordinary skill in the art. One common means of electrical coupling is through the use of solder 150 points connecting portions of the ground layers 134 to conductive surface 142. One advantage to the relatively large conductive surface 142 of component carrier 132 is that if cracks 152 or electrical openings form on conductive surface 142 its shielding effect is not lost.

Figure 2:
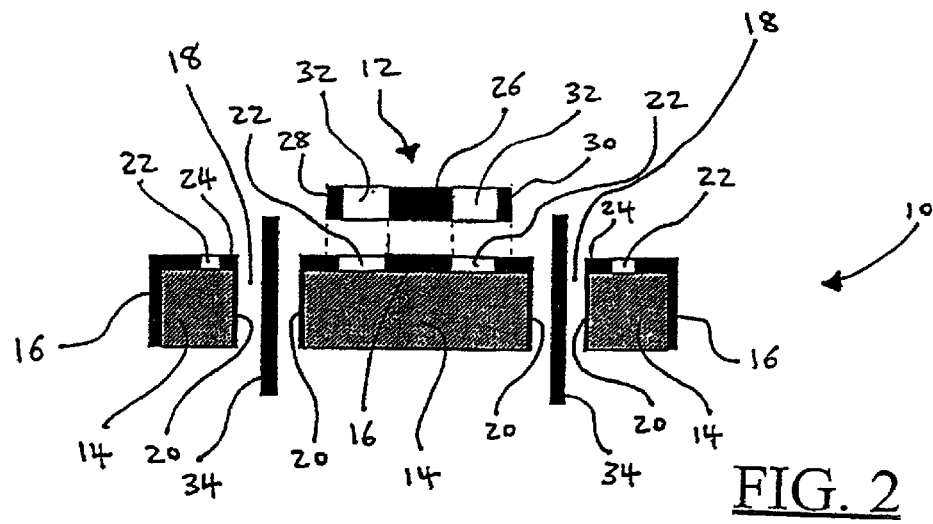
FIG. 2 is an elevational view in cross section of a single-sided surface mount component carrier of the present invention.

A more specific embodiment of the present invention illustrated in FIG. 2 is surface mount component carrier 10 for maintaining a ceramic planar surface mount electrical component, such as a differential and common mode filter as is disclosed in application Ser. Nos. 08/841,940; 09/008,769; and 09/056,379, incorporated herein by reference. Carrier 10 is a disk comprised of an insulator 14, such as ceramic, having at least two apertures 18. Insulator 14 is covered by a conductive metalized ground surface 16, at least two conductive pads 24 surrounding apertures 18, and insulating bands 22 surrounding each conductive pad 24. Throughout the written description "insulator" or "insulating material" may also be referred to as "planar insulator." Insulating bands 22 separate and electrically isolate conductive pads 24 from metalized ground surface 16. In the top plan view of carrier 10, shown in FIG. 3, the preferred embodiment of the invention is circular in shape with square insulating bands 22 surrounding partially rounded conductive pads 24. Carrier 10 and its various elements can be formed into many different shapes and Applicant does not intend to limit the scope of the invention to the particular shapes shown in the drawings.

Figure 20:
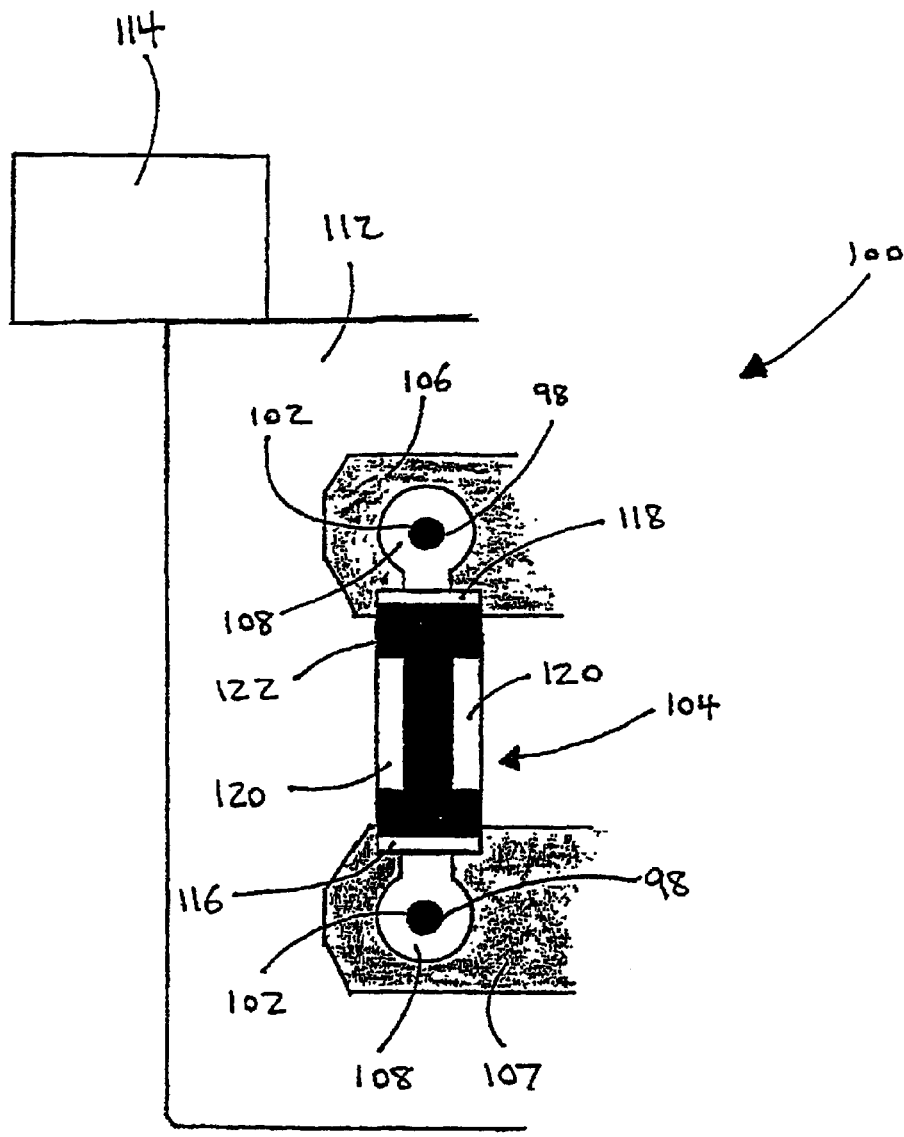
FIG. 20 is a partial top plan view of the connector surface mount differential and common mode carrier shown in FIG. 19.

Referring again to FIG. 2, in the preferred embodiment, metalized ground surface 16 covers a substantial portion of the top and sides of carrier 10. Through-hole plating 20 covers the inner walls of aperture 18 and electrically couples to the corresponding conductive pad 24. Through-hole plating 20 provides greater surface area for electrical coupling of conductors 34 to conductive pads 24 as the conductors 34 are disposed through apertures 18. The configuration of metalized ground surface 16, insulating bands 22 and conductive pads 24 provide the necessary contacts for connecting a surface mount component, such as differential and common mode filter 12, to the upper surface of carrier 10, which in turn provides electrical connection between conductors 34 and surface mount component 12. The surface mount components referred to, such as differential and common mode filter 12, are provided in standard surface mount packages which include a number of solder terminations for electrically coupling, the device to external circuitry or in this case to carrier 10. Filter 12 includes first differential electrode band 28 and second differential electrode band 30 extending from either end of filter 12. Extending from the center of filter 12 is at least one and more typically two, common ground conductive bands 26. An insulated outer casing 32 electrically isolates first and second differential electrode bands 28 and 30 and common ground conductive bands 26 from one another. A top plan view of a standard surface mount device as just described is shown in FIG. 20 as differential and common mode filter 104. The filter 104 is comprised of first differential conductive band 116, second differential conductive band 118 and two common ground conductive bands 120. The insulated outer casing 122 separates and electrically isolates each of the various conductive bands from one another.

FIG. 2 shows filter 12 positioned upon the top surface of carrier 10 so that the common ground conductive bands 26 come in contact with the portion of the metalized ground surface 16 which separates both of the insulating bands 22 from one another. This is accomplished by positioning differential and common mode filter 12 lengthwise between the two conductive pads 24 such that first differential electrode band 28 is in contact with one of the two conductive pads 24 and second differential electrode band 30 comes in contact with the other conductive pad 24. Once filter 12 has been positioned, by default, insulated outer casing 32 of filter 12 aligns with portions of insulating bands 22 thereby maintaining electrical isolation between the various conductive and electrode bands of filter 12. First and second differential conductive bands 28 and 30 and the common ground conductive bands 26 consist of solder terminations found in typical surface mount devices. Once filter 12 is positioned upon carrier 10 standard solder reflow methods are employed causing the solder terminations to reflow thereby electrically coupling and physically bonding filter 12 to carrier 10. Customary soldier reflow methods which can be used include infrared radiation (IR), vapor phase and hot air ovens or any other means which can be used to expose the solder to sufficiently elevated temperatures. Once differential and common mode surface mount filter 12 is coupled to carrier 10, the combination of the two parts can be manipulated, either manually or through various types of automated equipment, without subjecting filter 12 to mechanical and physical stresses normally associated with the handling of miniature and delicate electronic components.

Once coupled to carrier 10, filter 12 is electrically connected to external circuitry through conductors 34 which may consist of wire leads or lengths of flexible wire. Once disposed through apertures 18, conductors 34 are soldered to conductive pads 24 and within apertures 18. Thru-hole plating 20 allows solder applied to conductive pads 24 and conductors 34 to flow into apertures 18 thereby adhering to the thru-hole plating. Component carrier 10 reduces mechanical and physical stresses such as shock, vibration and various thermal conditions which filter 12 would otherwise be subjected to and provides a complete ground shield for filter 12. Because carrier 10 has a greater surface area then filter 12 and a substantial portion of that surface area is covered by metalized ground surface 16, carrier 10 acts as a ground shield which absorbs and dissipates electromagnetic interference and over voltages. These added benefits improve the overall functional performance and characteristics of filter 12.

Figure 4:
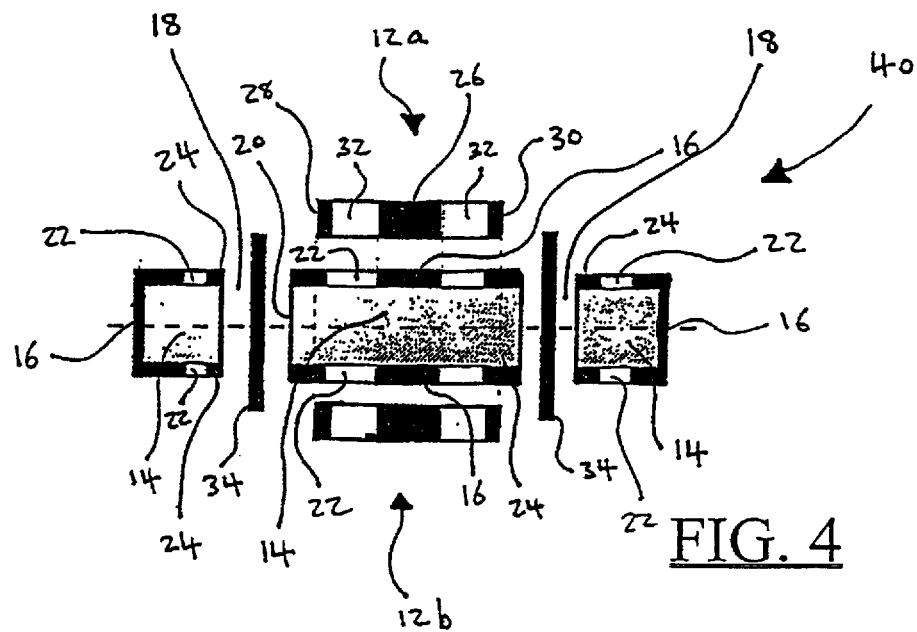
FIG. 4 is an elevational view in cross section of a double-sided surface mount component carrier of the present invention.
Figure 5:
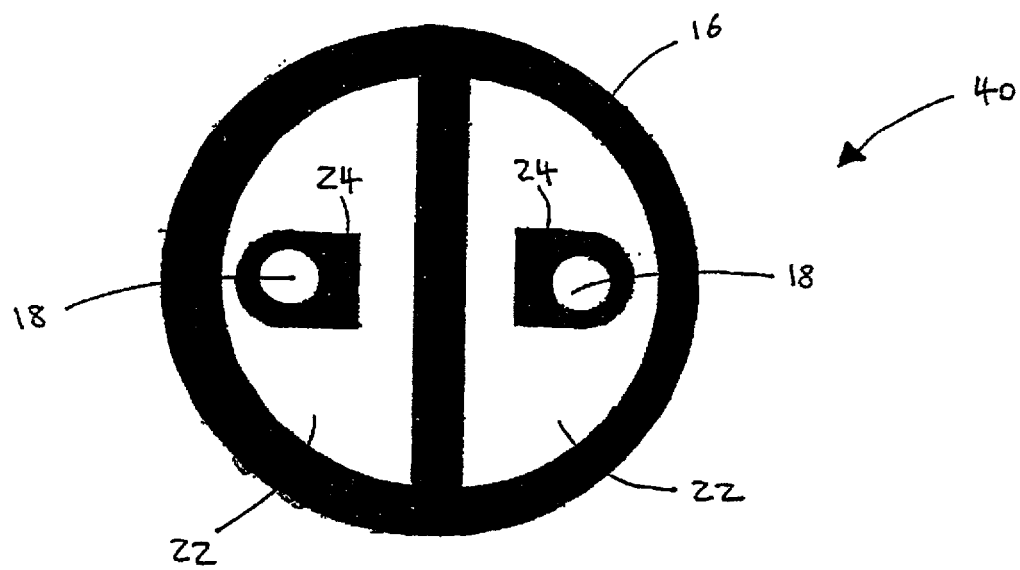
FIG. 5 is a top plan view of the surface mount component carrier shown in FIG. 4.

FIGS. 4 and 5 illustrate a further alternate embodiment of the present invention, that being double-sided carrier 40. Carrier 40 is identical to carrier 10, as shown in FIG. 2, except that carrier 40 is double-sided and as a bottom surface which is substantially identical to the top surface. This configuration allows two differential and common mode surface mount filters 12a and 12b to be mounted to the upper and lower surfaces of carrier 40. As illustrated in FIG. 4, metalized ground surface 16 covers substantial portions of the top, sides and bottom of carrier 40 providing a greater overall surface area. The increased surface area of metalized ground surface 16 imparts greater shielding characteristics in carrier 40 which absorb and dissipate electromagnetic interference. In addition, both the top and bottom of carrier 40 include corresponding conductive pads 24 which are electrically connected to one another by thru-hole plating 20 which corers the inner walls of apertures 18.

Double-sided carrier 40 is also advantageous in that it allows for flexibility needed to meet electromagnetic interference (EMI) and surge protection requirements simultaneously through integration of different surface mount components on the same carrier substrate. As an example, a differential and common mode filter, as previously described, could be coupled to the top of carrier 40 while a MOV device could be coupled on the bottom of carrier 40 effectively placing the filter and MOV devices in parallel to provide EMI and surge protection in one compact, durable package. Because carrier 40 provides a rigid base for maintaining various electronic surface mount components, the components themselves are subjected to less physical stress during manufacturing processes which in turn increases yields and lowers manufacturing costs.

Figure 3:
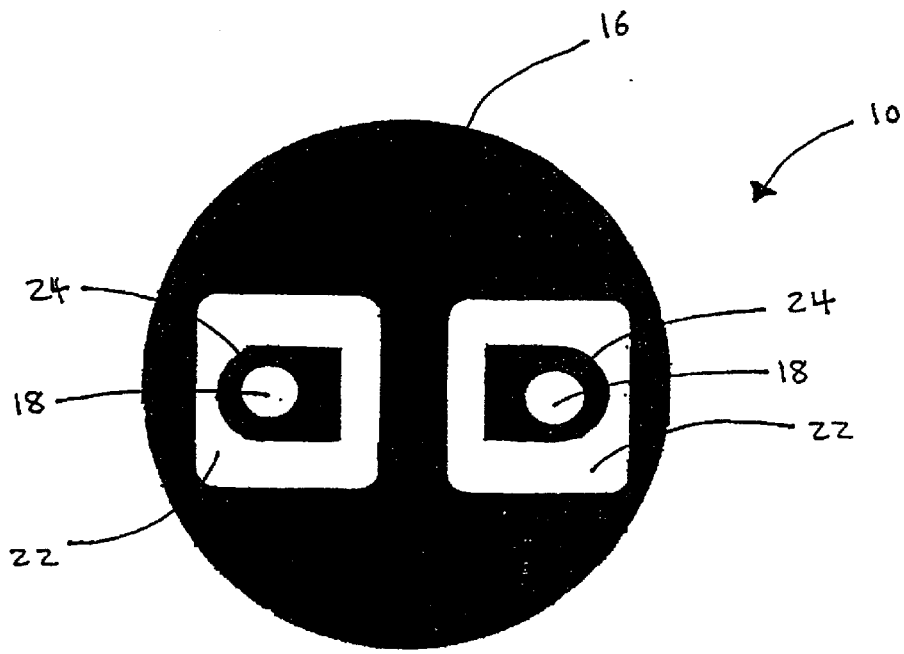
FIG. 3 is a top plan view of the surface mount component carrier shown in FIG. 2.

FIG. 5 shows a modified configuration of metalized ground surface 16, conductive pads 24 and insulating bands 22. In this alternative embodiment, insulating bands 22 have been substantially increased such that the surface area of carrier 40 is substantially covered by insulation as opposed to a metalized ground surface. This configuration can be used when decreased shield characteristics are desired or the particular interaction between carrier 40 and the surface mount component needs to be precisely controlled. One example is when parasitic capacitance values must be maintained below a certain level. Note that the particular shapes of insulating bands 22, shown in FIG. 5, are not necessary. All that is required is that the surface area covered by metalized ground surface 16 be varied which in turn varies the electrical characteristics of double-sided carrier 40. It should also be noted that the surface pattern shown in FIG. 3 can be used with the double-sided carrier 40, shown in FIG. 4, or the surface pattern shown in FIG. 5 could just as easily be used with carrier 10, shown in FIG. 2. To obtain further of control the electrical characteristics of double-sided carrier 40, one surface could be configured as shown in FIG. 5 while the other surface, either top or bottom, could be configured as shown in FIG. 3. Altering the upper and lower surface patterns of double-sided carrier 40 depending upon the types of surface mount components coupled to carrier 40 allows for obtaining optimal electrical characteristics as needed.

Figure 6:
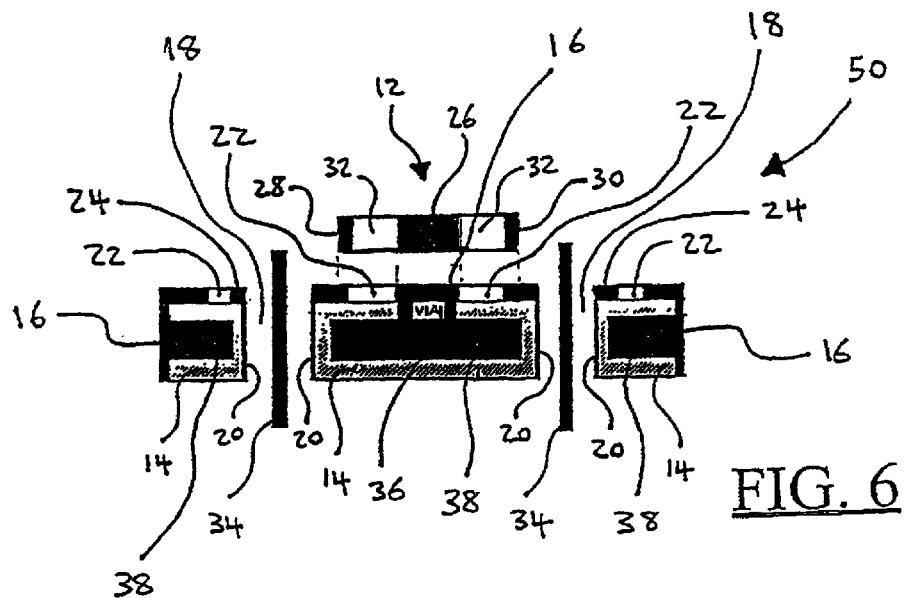
FIG. 6 is an elevational view in cross section of an alternate embodiment of a single-sided surface mount component carrier of the present invention.
Figure 7:
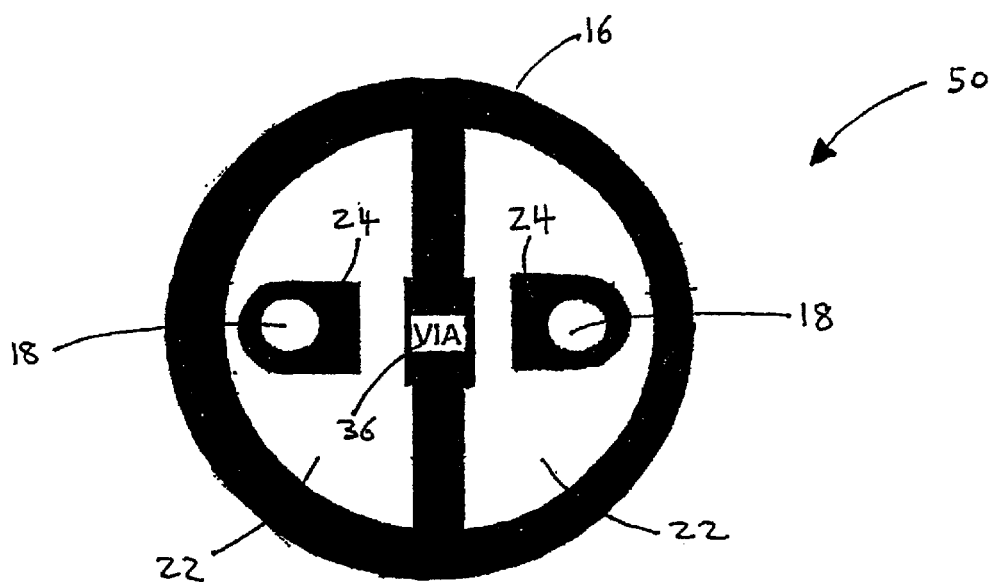
FIG. 7 is a top plan view of the surface mount component carrier shown in FIG. 6.

FIGS. 6 through 9 illustrate further alternate embodiments of the single and double-sided carriers shown in FIGS. 2 through 5. Referring to FIG. 6, single-sided carrier 50 is similar to carrier 10 of FIG. 2 except that carrier 50 includes a conductive core 38 imbedded within insulator 14 which is electrically coupled to metalized ground surface 16. As shown in FIGS. 6 and 7, conductive core 38 abuts and comes in contact with metalized ground surface 16 along the sides of carrier 50. A via 36 is disposed within the center of carrier 50 which provides an additional electrical connection between the metalized ground surface 16 which covers the top of carrier 50 and conductive core 38. Via 36 is a small aperture formed in the surface of carrier 50 which passes through insulator 14 and comes in contact with conductive core 38. Although not shown, via 36 includes thru-hole plating which electrically connects conductive core 38 and metalized ground surface 16. FIG. 7 shows the surface configuration for carrier 50 which is identical to that shown in FIG. 5 with the addition of via 36. As described earlier, the surface configuration of carrier 50 can vary. For example, the surface configuration could be similar to that shown in FIG. 3 with the addition of via 36 disposed within its center. The benefit to embedding conductive core 38 within insulator 14 and electrically connecting conductive core 38 to metalized ground surface 16 is that a greater surface area is provided for absorbing and dissipating electromagnetic interference and over voltages without an increase in the overall dimensions of carrier 50.

Figure 8:
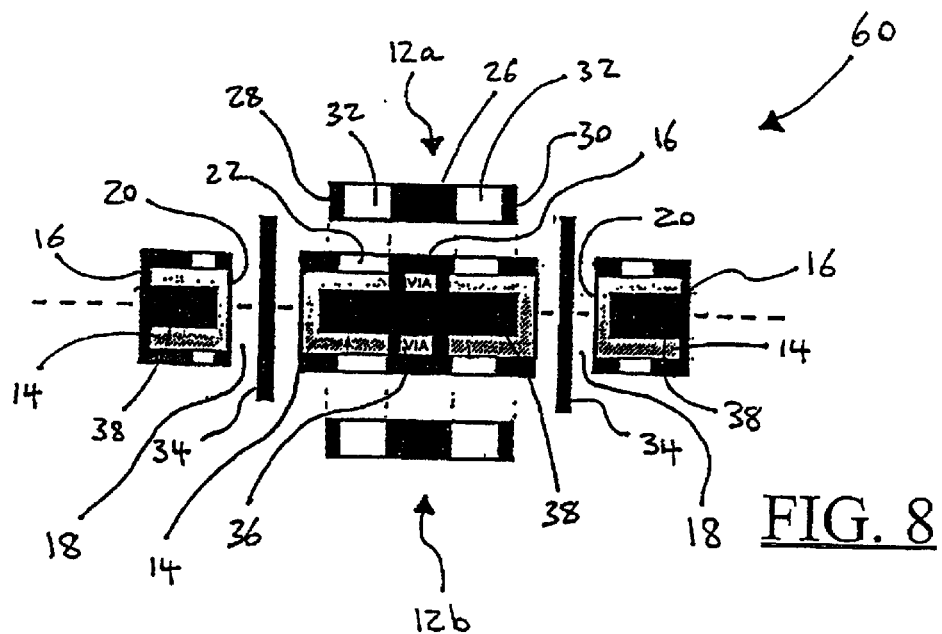
FIG. 8 is an elevational view in cross section of an alternate embodiment of a double-sided surface mount component carrier of the present invention.
Figure 9:
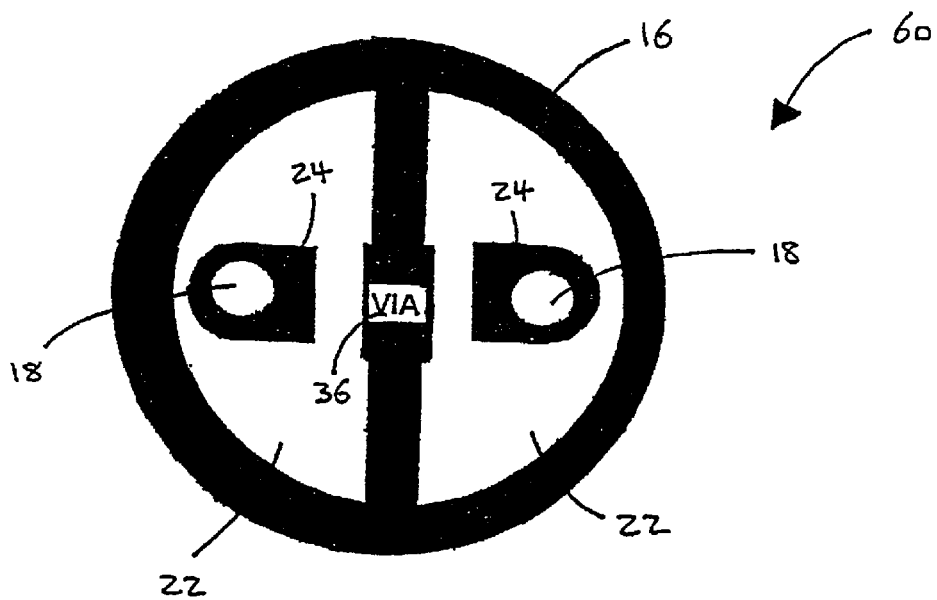
FIG. 9 is a top plan view of the surface mount component carrier shown in FIG. 8.

FIGS. 8 and 9 disclose a further alternate embodiment of the present invention in double-sided carrier 60. Carrier 60 is identical to carrier 50, shown in FIGS. 6 and 7, except that it is double-sided as the embodiment shown in FIG. 4 with the addition of via 36 disposed through the bottom of carrier 60 electrically coupling metalized ground surface 16 along the bottom of carrier 60 to conductive core 38. This embodiment provides a ground having an increased surface area to both surface mount differential and common mode filter components 12a and 12b coupled to the top and bottom of double-sided carrier 60.

Figure 10A:
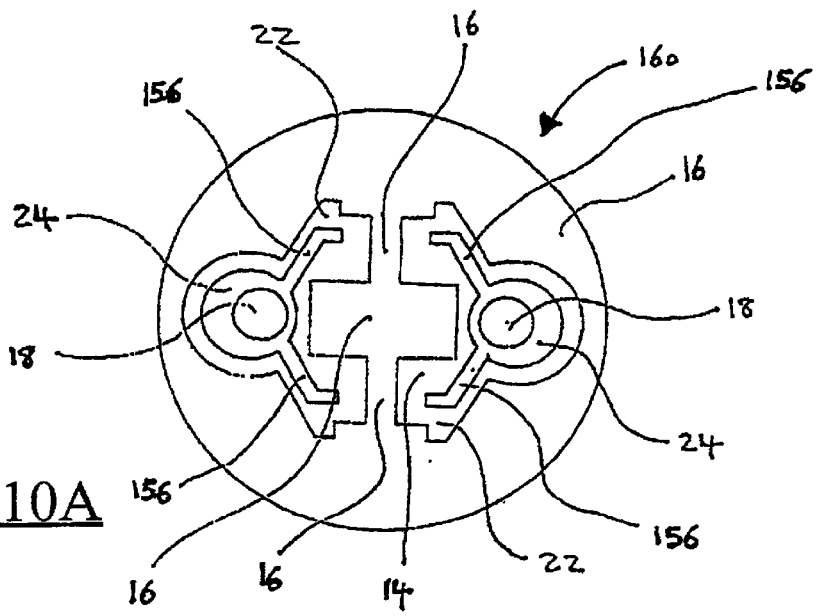
FIGS. 10A and 10B are top plan views of a surface mount component carrier with and without a differential and common mode filter, as shown in FIG. 10C, attached to the component carrier.
Figure 10B:
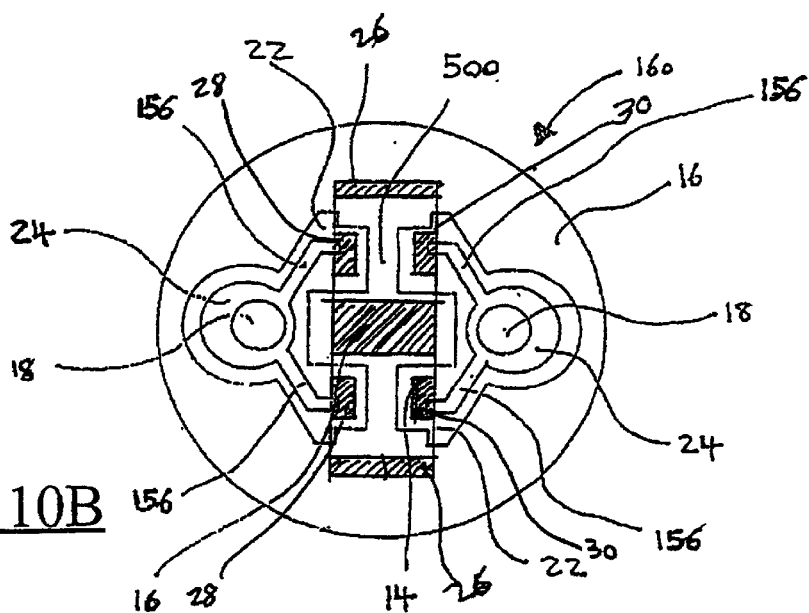

FIGS. 10A and 10B show a further embodiment of the component carriers shown in FIGS. 2–9 configured to accept single and multiple surface mount components and more specifically surface mount differential and common mode filters. As in the numerous embodiments already described, parallel component carrier 160 is a plate or disc comprised of insulating material 14, such as ceramic, having at least two apertures 18. Insulating material 14, also commonly referred to as a planar insulator, is covered by conductive ground surface 16, at least two conductive pads 24 surrounding apertures 18, and insulating bands 22 surrounding each conductive pad 24. Insulating bands 22 separate and isolate conductive pads 24 from conductive ground surface 16. The primary difference between parallel component carrier 160 and the surface mount component carriers previously described is the arrangement of conductive traces 156 extending from conductive pads 24. Each conductive pad 24 includes two conductive traces 156 which extend from one side of conductive pad 24 in a generally Y-shaped pattern thereby separating each of the conductive traces 156 from one another. The Y-shaped patterns of conductive traces 156 are arranged on parallel component carrier 160 so the distal ends of each conductive trace 156 is aligned with the distal end of an opposing conductive trace 156, each extending from opposite conductive pads 24. In the parallel component carrier 160 embodiment insulating bands 22 surround not only conductive pads 24 but also extending conductive traces 156 of each conductive pad 24 thereby electrically isolating conductive pads 24 and their associated conductive traces 156 from conductive ground surface 16.

Although not required, conductive ground surface 16 is configured to cover as much area upon insulating material 14 as possible in order to provide for maximum electrical shielding within a predetermined area. Due to the Y-configuration of conductive traces 156, conductive ground surface 16 in the preferred embodiment encompasses a large rectangular portion between the opposing Y-configurations of conductive traces 156 with smaller portions of conductive ground surface 16 extending between the distal ends of opposing conductive traces 156.

Figure 10C:
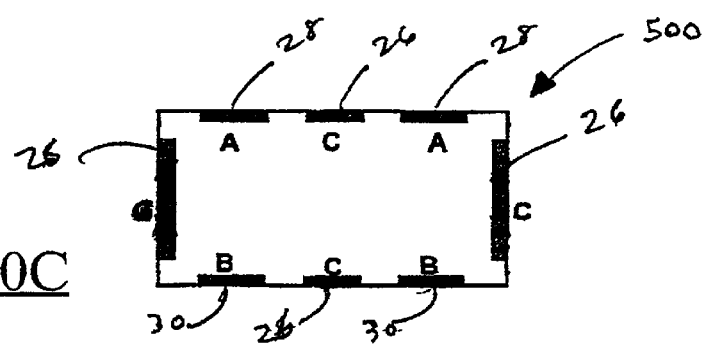
FIG. 10D is a top plan view of a multi surface mount component carrier with differential and common mode filters.

FIG. 10B shows parallel component carrier 160 with differential and common mode filter 500, as shown in FIG. 10C, coupled thereto. The surface mount differential and common mode filter 500 has its first differential electrode bands 28 electrically coupled to the distal end of one conductive trace 156, its second differential electrode bands 30 electrically coupled to the distal ends of the opposing conductive trace 156 and its common ground conductive bands 26 electrically coupled to the portion of conductive ground surface 16 which separates the distal ends of the opposing conductive traces 156. The electrical coupling of the various electrodes of differential and common mode filter 500 is achieved through means well known in the art including but not limited to soldering. In operation, component carrier 160 receives electrical conductors (not shown) within apertures 18, which are then electrically coupled to conductive pads 24 through soldering or other methods.

The multiple first and second electrode bands 28 and 30 differential and common mode filter 500 are separated by common ground electrode bands 26 arid mounted on parallel component carrier 160. This configuration provides improved filtering and decoupling performance which results in a further reduction of equivalent series inductance (ESL) and equivalent series resistance (ESR). The interweaving arrangement of the first and second electrode bands 28 and 30 and the common ground electrode bands 26 optimizes the charge of differential and common mode filter and decoupler 500.

Figure 10D:
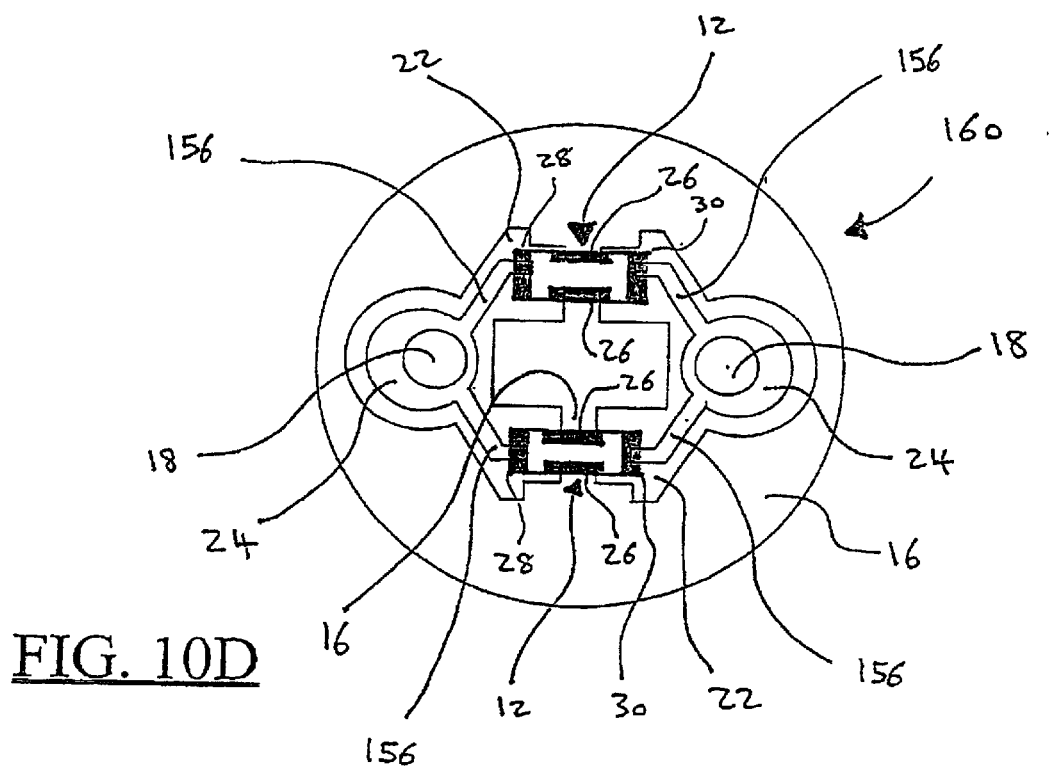

FIG. 10D shows parallel component carrier 160 with two differential and common mode filters 12 coupled thereto. Each surface mount differential and common mode filter 12 has its first differential electrode band 28 electrically coupled to the distal end of one conductive trace 156, its second differential electrode band 30 electrically coupled to the distal end of the opposing conductive trace 156 and its common ground conductive bands 26 electrically coupled to the portion of conductive ground surface 16 which separates the distal ends of the opposing conductive traces 156. The electrical coupling of the various bands of differential and common mode filter 12 is achieved through means well known in the art including but not limited to soldering. In operation, parallel component carrier 160 receives electrical conductors (not shown) within apertures 18, which are then electrically coupled to conductive pads 24 through soldering or other methods.

The configuration of parallel component carrier 160 provides electrical coupling between each electrical conductor (not shown) disposed within apertures 18 and the corresponding first and second differential electrode bands 28 and 30 of differential and common mode filter 12 thereby providing coupling of the electrical conductors with two differential and common mode filters 12 connected in parallel. The parallel differential and common mode filters 12 provide line-to-line and line-to-ground filtering to the electrical conductors due to their internal architecture which provides for an inherent ground even in the absence of conductive ground surface 16. Once the common ground conductive bands 26 of each filter 12 are electrically connected to conductive ground surface 16 the inherent ground characteristics of filter 12 increase substantially due to the expanded conductive surface area improving the electrical characteristics of both filters 12. Although not shown, it should be understood that parallel component carrier 160 can also be configured as a double-sided component carrier as disclosed in FIG. 4 thereby allowing it to accept four differential and common mode filters 12 as opposed to only two as shown in FIG. 10D. It should also be understood that the invention is not limited to either two or four differential and common mode filters 12. Multiple filters 12 could be arranged on either side of parallel component carrier 160 in an arrangement similar to that described with the only limitation being the physical space available which is dictated by the size of parallel component carrier 160. It should also be understood that any of the variations of parallel component carrier 160 can also include a conductive core coupled through vias to conductive ground surface 16 similar to the arrangement shown in FIG. 8 and described previously. Such an arrangement, including an inner conductive core, provides even greater surface area to the conductive ground surface further increasing the electrical shielding and the overall performance characteristics of the differential and common mode filters 12 coupled to parallel component carrier 160.

FIGS. 11–14 illustrate further alternate embodiments of the component carriers of the present invention which receive a plurality of differential and common mode filters 12 for use in connector and prototype assemblies. Referring to FIG. 11A, multi-chip component carrier 170 is shown which is configured for use in electrical connectors such as D-sub connectors. As in previous embodiments of the present invention, multi-chip component carrier 170 is built upon insulating material 172. Most of the surface area of component carrier 170 consists of insulating material 172. FIGS. 11B and 11C, which disclose cross-sections of component carrier 170, show that ground layer 174 is embedded within insulating material 172 and spans the majority of the area of component carrier 170. Ground layer 174 is conductive and typically consists of a metallic material, although any type of conductive matter could be substituted. In addition to ground layer 174 being embedded within component carrier 170, the peripheral edges of component carrier 170 also include conductive surfaces 176 which are electrically coupled to ground layer 174. The internal ground layer 174 of component carrier 170 is also electrically connected to a plurality of vias 182 which extend to conductive pads 180 formed on the surface of component carrier 170. As is well known in the art, vias 182 include conductive plating which electrically connects conductive pads 180 to ground layer 174, which in turn is electrically coupled to peripheral conductive surface 176. Also disposed in component carrier 170 are a plurality of feed-thru apertures 178 which are electrically isolated from internal ground layer 174 by insulation 188. Formed around the various feed-thru apertures 178 are first and second electrode pads 184 and 186. Each first electrode pad 184 is formed in a predetermined position in relation to a corresponding second electrode pad 186 wherein the combination of first and second electrode pads 184 and 186 include a via 182 positioned therebetween.

As shown in FIG. 11A, the plurality of differential and common mode filters 12 are positioned between the first and second electrode pads 184 and 186 in a lengthwise orientation such that first differential electrode band 28 comes in contact with first electrode pad 184 and a second differential electrode band 30 comes in contact with second electrode pad 186. Vias 182 are positioned between first and second electrode pads 184 and 186 so that conductive pads 180 of vias 182 come in contact with common ground conductive bands 26 of the differential and common mode filters 12. The various conductive bands of each filter 12 are physically and electrically coupled to their respective conductive pads through soldering or other well known means. In operation, multi-chip component carrier 170 is placed over and receives within its plurality of feed-thru apertures 178 male pins (not shown) associated with standard D-sub connector assemblies. The plurality of pins are then electrically coupled to the plurality of first and second electrode pads 184 and 186 through standard means. In alternate embodiments feed-thru apertures 178 are plated with a conductive surface electrically connected to its associated first or second electrode pad 184 and 186 such that when the D-sub connector assembly pins (not shown) are inserted within feed-thru apertures 178 the physical contact between the pins and the conductive surfaces provides the necessary electrical coupling.

FIG. 12 shows a further embodiment of the present invention consisting of a differential and common mode strip filter carrier 200. Differential and common mode strip filter 202 is disclosed in commonly owned, application Ser. No. 08/841,940; 09/008,769; and 09/056,379, incorporated herein by reference. As in previous embodiments, strip filter carrier 200 is constructed upon a plate or block of insulating material 216 and includes a plurality of feed-thru apertures 204 which receive male pins (not shown) from a connector assembly such as an RJ-45 connector. Referring to FIG. 12A, the top surface of carrier 200 includes conductive surface 210 running along the four edges of the top surface with portions of conductive surface 210 extending inward in a predetermined pattern. Conductive surface 210 is electrically coupled to peripheral conductive surface 208 which surrounds the four sides of carrier 200, which is then electrically coupled to conductive surface 206. Conductive surface 206 covers the majority of the area of the bottom surface of strip filter carrier 200 as shown in FIG. 12B. Each feed through aperture 204, as shown in FIG. 12A, includes a conductive track extending from aperture 204 towards the center of strip filter carrier 200 in a predetermined pattern. A portion of differential and common mode strip filter 202 is shown positioned upon the top surface of carrier 200 to demonstrate its coupling to strip filter carrier 200. Common ground conductive band 218 of filter 202 comes in contact with conductive surface 210 that runs along the longitudinal ends of strip filter carrier 200. The predetermined positioning of the first and second differential electrode bands 220 and 222 of filter 202 align with their corresponding conductive tracks 226 and the common ground conductive bands 218 align with the inward extending conductive surfaces 210. As described in the previous embodiments, the conductive bands are electrically connected to their corresponding conductive tracks and conductive surfaces through means including but not limited to soldering. As shown in FIG. 12B, feed-thru apertures 204 are surrounded by conductive bands 214 which, in turn, are then electrically isolated from conductive surface 206 by insulation bands 212. As shown in FIG. 12C, a substantial area of conductive surface 206 is electrically coupled through peripheral conductive surfaces 208 to conductive surface 210, which in turn is electrically coupled to common ground conductive band 218 of strip filter 202. This arrangement provides for the increased shielding and improved electrical characteristics of differential and common mode strip filter 202 previously described in relation to alternate embodiments of the present invention.

In use carrier 200 is placed over and receives within feed-thru apertures 204 a plurality of male pins (not shown) from a connector assembly. Feed-thru apertures 204 include a conductive surface plating so that each conductive track 226 is electrically coupled to its corresponding conductive band 214. Either through soldering or a conductive resistive fit, each male pin (not shown) is electrically coupled to its corresponding first or second differential electrode band 220 and 222 of differential and common mode strip filter 202.

FIGS. 13A–13C show a further alternate embodiment of the present invention. FIGS. 13A and 13B disclose differential and common mode strip filter carrier 230 having most of the top and bottom surface area composed of insulating material 216 with only a 30 small border of conductive surface 210 surrounding the outer edges of both the top and bottom surface of strip filter carrier 230. Conductive surface 21 0 also surrounds the sides of strip filter carrier 230 and electrically couples to the conductive surface 210 running along the edges of both the top and bottom surfaces. Referring to FIG. 12A, conductive surface 210 also includes portions which extend inward toward the center of the top surface of strip filter carrier 230 in a predetermined pattern. Although not shown, strip filter carrier 230 is configured to receive differential and common mode strip filter 202 as shown in FIG. 12A.

One difference in strip filter carrier 230 from component carrier 200 as disclosed in FIGS. 12A–12C is that ground layer 234 is now embedded within insulating material 216 and electrically coupled to conductive surfaces 210, which run along the sides of strip filter carrier 230, and through vias 232. Ground layer 234 is also electrically coupled to conductive surface 210 through vias 232 disposed within the inwardly extending portions of conductive surface 210 on the top surface of strip filter carrier 230. Again, strip filter carrier 230 includes feed-thru apertures 204 having a conductive surface plating which electrically couples conductive tracks 226 on the top surface of strip filler carrier 230 to conductive bands 214 on the bottom surface of strip filter carrier 230. Male pins (not shown) from a connector assembly are received within feed-thru apertures 204 allowing for electrical coupling to the various first and second differential electrode bands of differential and common mode strip filter 202 (not shown). As shown in FIG. 13C, each feed-thru aperture 204 is surrounded by insulation 224 electrically isolating the male pins inserted through apertures 204 from the internal ground layer 234 of strip filter carrier 230. FIGS. 11–13 demonstrate that a variety of component carrier configurations are contemplated by applicant which include embodiments for receiving different component packages for differential and common mode filters. In addition, various configurations of the conductive surface or ground layer are envisioned which provide for additional electrical shielding and substantially improve the electrical characteristics and performance of the differential and common mode filters attached to the carriers.

FIGS. 14A–14D illustrate a multi-component differential and common mode filter prototype carrier 240 which allows use of a plurality of differential and common mode filters 12 in combination with the benefits provided by the component carriers as described herein. At the same time prototype carrier 240 allows for additional circuitry to be coupled to carrier 240 and filters 12 in a convenient and flexible manner allowing engineers to easily incorporate the technology described into a vast array of electronic products. Prototype carrier 240 is constructed in a similar manner to that of the many previously described embodiments. Prototype carrier 240 consists of a plate of insulating material 242 having predetermined configurations of conductive surface 244 along its top and bottom surfaces and electrically interconnected by peripheral conductive surface 246 which surrounds the sides of prototype carrier 240. Positioned upon both the top and bottom surfaces of prototype carrier 240 are a plurality of smaller conductive surfaces 250 which in turn are surrounded by insulating material 242 electrically isolating conductive surfaces 250 from conductive surfaces 244.

Figure 14A:
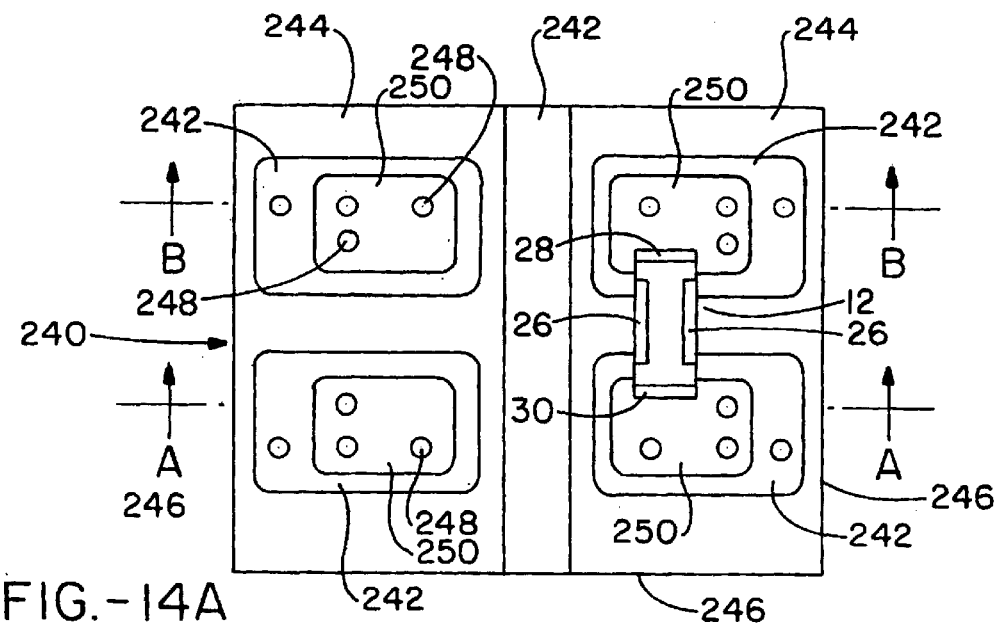
FIG. 14A is a top plan view of a multi surface mount component prototype carrier.
Figure 14B:
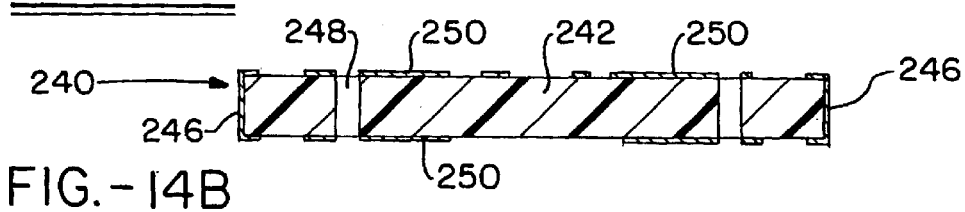
FIG. 14B is an elevational view in cross section of the component carrier shown in FIG. 14A along lines A—A.
Figure 14C:
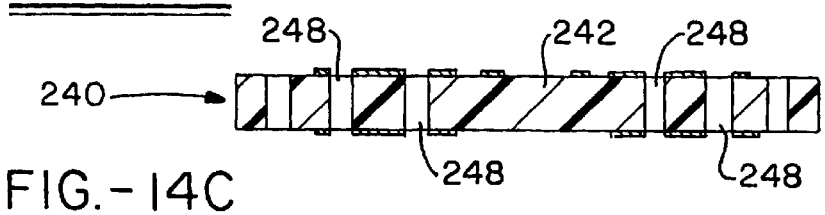
FIG. 14C is an elevational view in cross section of the component carrier shown in FIG. 14A along lines B—B.
Figure 14D:
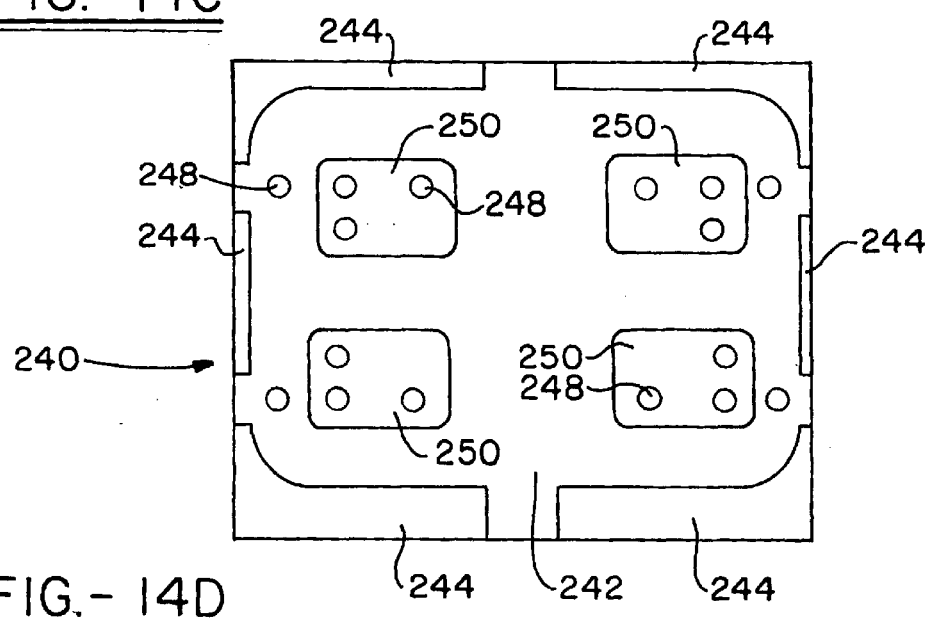
FIG. 14D is a bottom plan view of the component carrier shown in FIG. 14A.

As shown in FIG. 14A, differential and common mode filter 12 is positioned lengthwise between two corresponding conductive surfaces 250 such that first differential electrode band 28 comes into physical contact with one conductive surface 250, second differential electrode band 30 comes in contact with a second and corresponding conductive surface 250 and common ground conductive bands 26 come in physical contact with conductive surface 244 which separates the two corresponding conductive surfaces 250. As in previous embodiments, the various bands of filter 12 are electrically coupled to their respective conductive surfaces through soldering and other common means. To provide the versatility required to interconnect additional electronic components to prototype carrier 240 and differential and common mode filter 12, a plurality of apertures 248 are disposed within conductive surfaces 250 and insulating material 242. To use prototype carrier 240 various external electrical components or wires are disposed within apertures 248 and then permanently connected through soldering or other means. Prototype carrier 240 is essentially a "bread board" which electrical engineers use to configure test circuits. Although not shown, it should be understood and applicant contemplates that the prototype carrier 240 disclosed in FIGS. 14A–14D could be configured with an internal ground layer electrically coupled to conductive surfaces 244 through vias as disclosed previously in FIGS. 11 and 13. This arrangement would provide for greater effective surface area with increased shielding effects.

Figure 15:
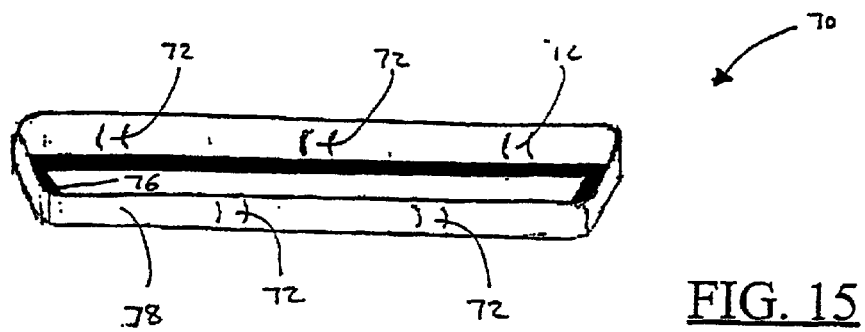
FIG. 15 is a perspective view of a connector carrier of the present invention.
Figure 16:
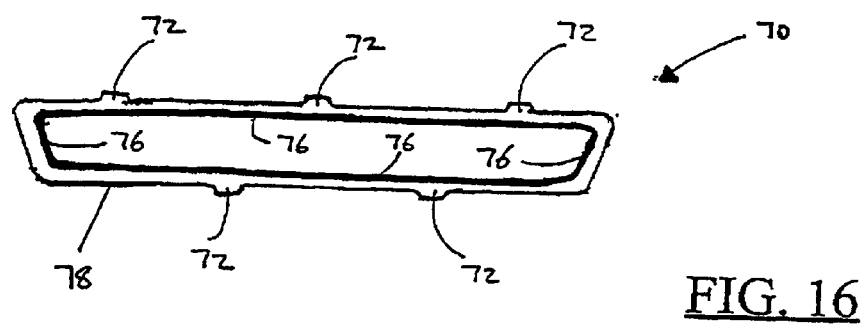
FIG. 16 is a top plan view of the connector carrier shown in FIG. 15.
Figure 17:
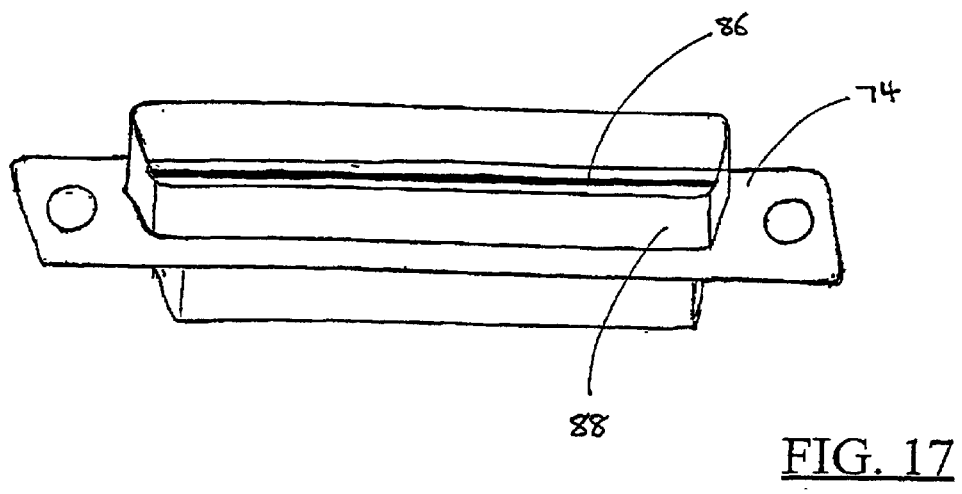
FIG. 17 is a perspective view of a standard connector shell.

Illustrated in FIGS. 15 through 18 is a further alternate embodiment of the component carriers of the present invention used to receive and maintain a multi-conductor thru-hole filter within a multi-conductor connector shell. Connector carrier 70, shown in FIGS. 15 and 16, is comprised of wall 78 formed in the shape of a parallelogram or D-shape having a shelf 76 extending inward from wall 78 along the bottom of all four sides. Wall 78 includes a plurality of outwardly extending protuberances 72 which act as spring or resistive fit contacts for carrier 70 as will be further described. FIG. 17 shows a standard D-sub connector shell 74 which includes outwardly extending front wall 88 shaped in the form of a parallelogram or D-shape. Shell 74 has a shelf 86 extending inwardly from the bottom of wall 88 which acts as a stop and a mounting shelf for carrier 70.

Figure 18:
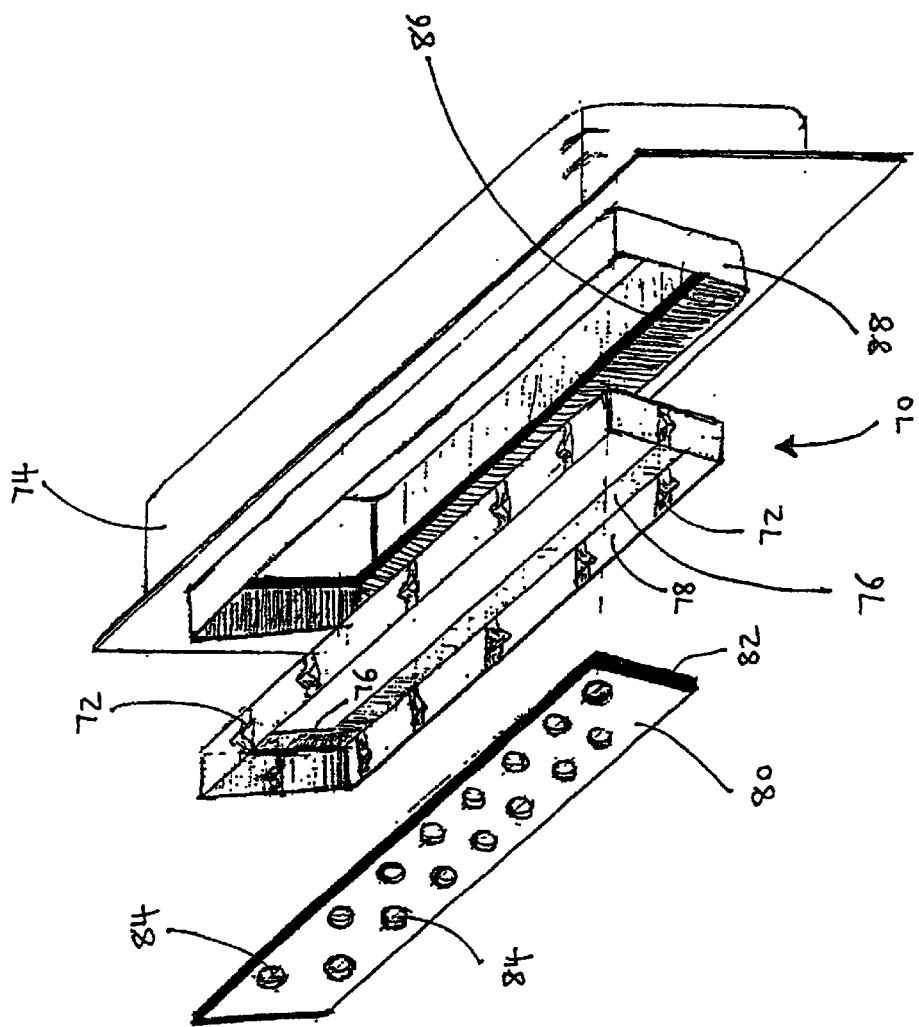
FIG. 18 is an exploded perspective view of the connector carrier of the present invention in operable cooperation with a standard connector shell and a multi-conductor differential and common mode filter.

FIG. 18 shows an exploded prospective view of D-sub connector shell 74, connecter carrier 70 and multi-conductor differential and common mode filter 80. While carrier 70 can be used with a variety of filters, Applicant contemplates multi-conductor filter 80 being a differential and common mode multi-conductor filter as disclosed in application Ser. Nos. 08/841,940; 09/008,769; and 09/056,379, previously incorporated herein by reference. Filter 80 includes a plurality of apertures 84 which receive contact pins (not shown) associated with male D-sub connectors commonly known in the art. One example of such a connector is a male D-sub RS-232 communications connector found in personal computers for coupling external devices such as modems to the computers. To be used in this embodiment of carrier 70, filter 80 music also be formed in the shape of a parallelogram or D-shape and have dimensions similar to those of carrier 70. Filter 80 includes plated surface 82 along its periphery which is electrically connected to the common ground conductive plates of filter 80. In use, conductor carrier 70 receives multi-conductor filter 80 which abuts against inner shelf 76. Shelf 76 is coated with a solder reflow or an equivalent conductive surface so that once filter 80 is inserted into carrier 70 and resting upon shelf 76, standard reflow methods can be used to solder filter 80 within carrier 70. Such standard reflow methods include the use of infrared radiation (IR), vapor phase and hot air ovens. The subassembly of filter 80 and carrier 70 is then inserted within D-sub connector shelf 74 so the subassembly is contained within wall 88 and abutted against shelf 86 which serves as a stop for carrier 70. Connector carrier 70 is fabricated from a conductive material such as metal and, to obtain the full benefits of the present invention, D-sub connector shell 74 will also be fabricated from a conductive metallic material. The plurality of protuberances 72 provide a resistive fit for carrier 70 against wall 88 of D-sub connector shelf 74 which maintains carrier 70 within shell 74 and provides for electrical conduction between plated surface 82 of filter 80 and shell 74. As in previous embodiments, electrically coupling the ground connection for multi-conductor filter 80 to carrier 70 and D-sub connector shell 74 increases the surface area provided for absorbing and dissipating electromagnetic interference and over voltages.

Figure 19:
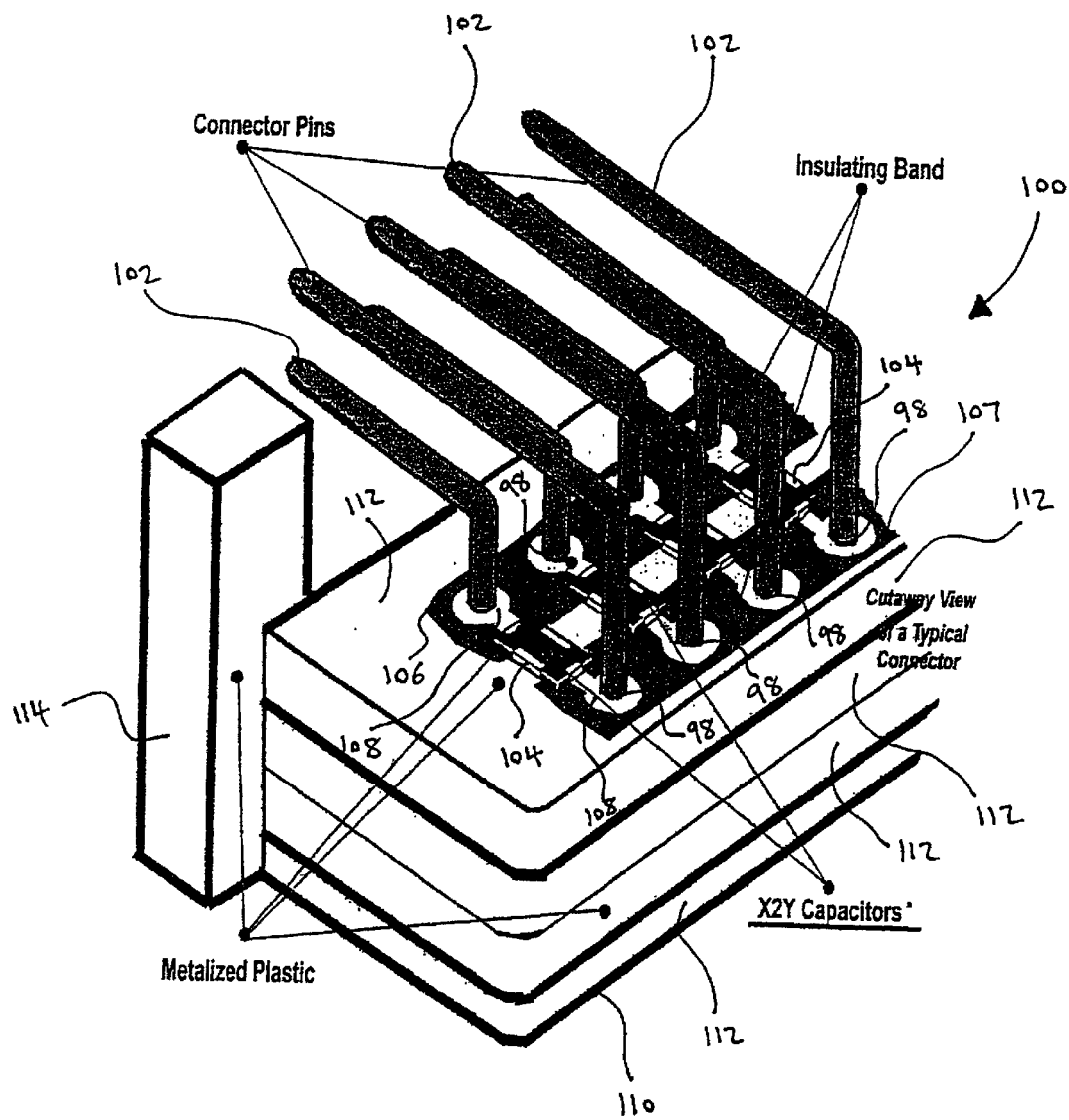
FIG. 19 is a partial perspective view of a further embodiment of a connector surface mount differential and common mode filter carrier of the present invention.

An additional embodiment of the present invention, connector carrier 100, is illustrated in FIG. 19. In this embodiment the surface mount component carrier is directly incorporated within an electronic connector. Connector carrier 100 is comprised of a metalized plastic base 112 having a plurality of apertures 98 disposed through base 112, each of which receives a connector pin 102. Although not shown, portions of each connector pin 102 extends through base 112 and out of the front 110 of connector carrier 100. The portions of pins 102 extending from the front 110 of carrier 100 form a male connector which is then, in turn, received by a female connector as is known in the art. The same configuration could be implemented on a female connector which then receives male pins. Coupled to both edges of connector carrier 100, although oily one edge is shown, is mounting base 114 which elevates base 112 from a surface such as a printed circuit board. The particular embodiment of connector 100 shown in FIG. 19 is of a right angle connector in which the tips of pins 102 would be inserted within apertures in a printed circuit board. Pins 102 would then be soldered to the individual apertures or pads in the printed circuit board to provide electrical connection between pins 102 and any circuitry on the printed circuit board. To provide for the coupling of a plurality of differential and common mode filters 104 between the various connector pins 102, two insulating bands 106 and 107 are provided to electrically isolate each of the connector pins 102 from the metalized plastic base 112 which covers substantially all of the surface area of connector carrier 100.

Referring to FIG. 20, the relationship between insulating bands 106 and 107, metalized plastic base 112 and differential and common mode filter 104 will be explained in more detail. While only one example is shown, both insulating bands 106 and 107 include a plurality of conductive pads 108 which surround apertures 98. Conductive pads 108 are electrically coupled to connector pins 102 disposed through apertures 98. Insulating bands 106 and 107 provide a non-conductive barrier between the conductive pads 108 and the metalized plastic base 112. Surface mount components, such as differential and common mode filter 104, are positioned between insulated bands 106 and 107 so that first differential conductive band 116 of filter 104 comes in contact with a portion of a conductive pad 108 and second differential conductive band 118 comes in contact with a portion of an opposite conductive pad 108. Insulated outer casing 122 of filter 104 slightly overlaps onto each insulating band 106 and 107 and metalized plastic base 112 to maintain electrical isolation of first and second differential conductive bands 116 and 118 and metalized plastic base 112 of connector carrier 100. Because metalized plastic base 112 runs between insulating bands 106 and 107, common ground conductive bands 120 of filter 104 come in contact with the metalized plastic base 112. As described earlier, each of the various conductive bands of filter 104 are comprised of solder terminations which, when subjected to known solder reflow methods, physically and electrically couple to any metallic surfaces which they come in contact thereby permanently coupling the surface mount components, i.e. filter 104, to connector carrier 100. As in the previous embodiments, connector carrier 100 allows miniature, fragile surface mount components to be used without subjecting those components to increased physical stress which can cause damage to the components, lowering production yields and increasing overall production costs. Metalized plastic base 112 also provides a large conductive surface area connected to the ground terminations of filter 104 improving the ground shield used to absorb and dissipate electromagnetic interference and over voltages.

Figure 21A:
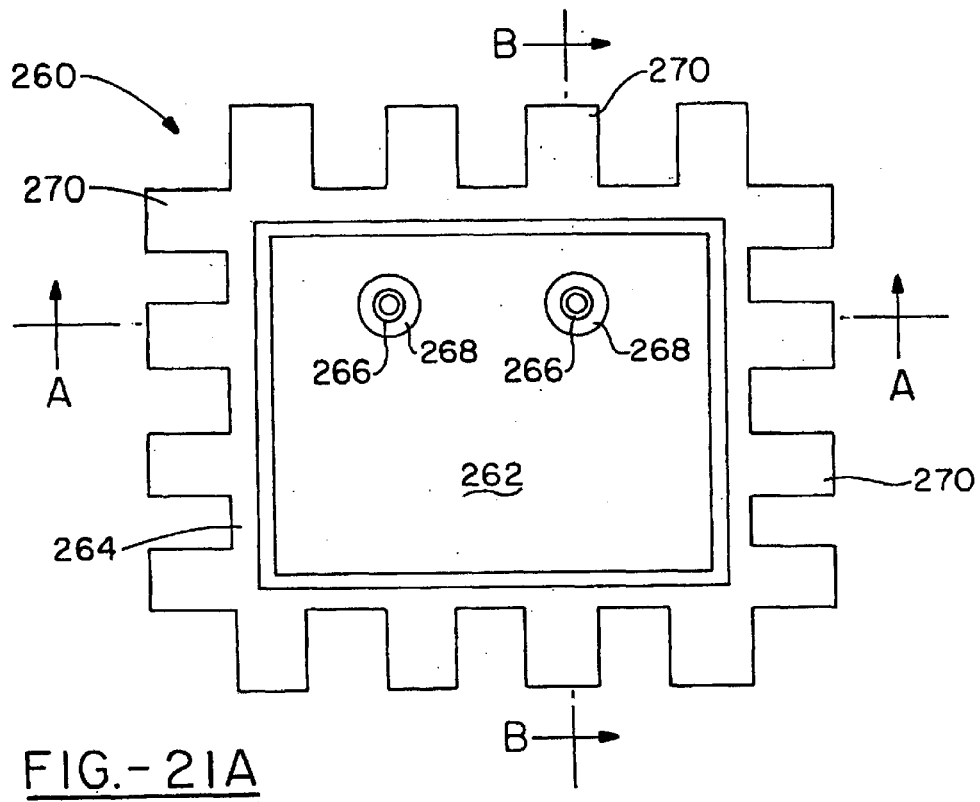
FIG. 21A is a top plan view of a strain relief carrier of the present invention.
Figure 21B:
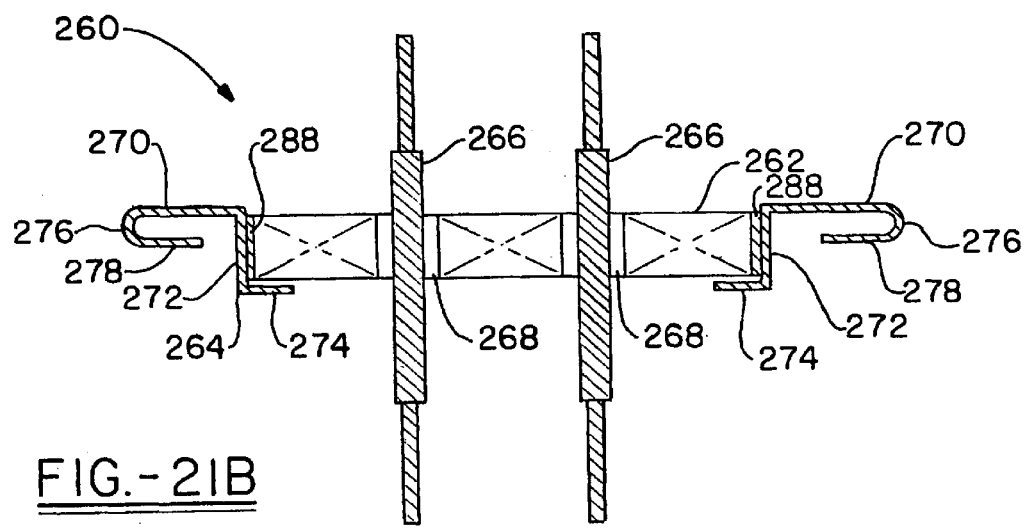
FIG. 21B is a side elevational view in cross section of the strain relief carrier shown in FIG. 21A along lines A—A.
Figure 21C:
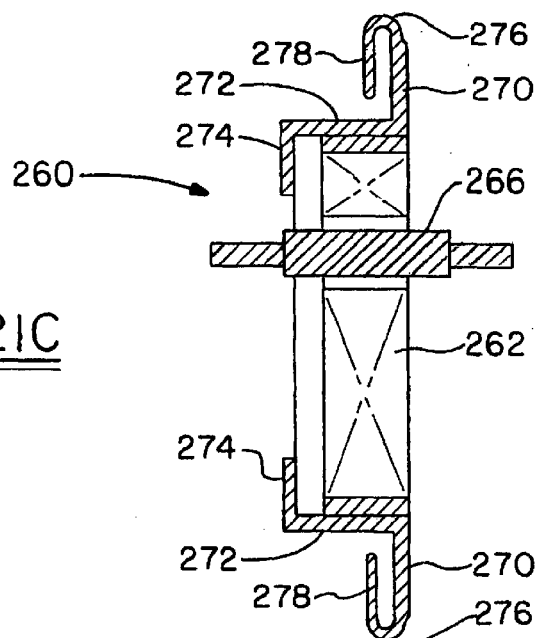
FIG. 21C is a side elevational view in cross section of the strain relief carrier shown in FIG. 21A along lines B—B.
Figure 21D:
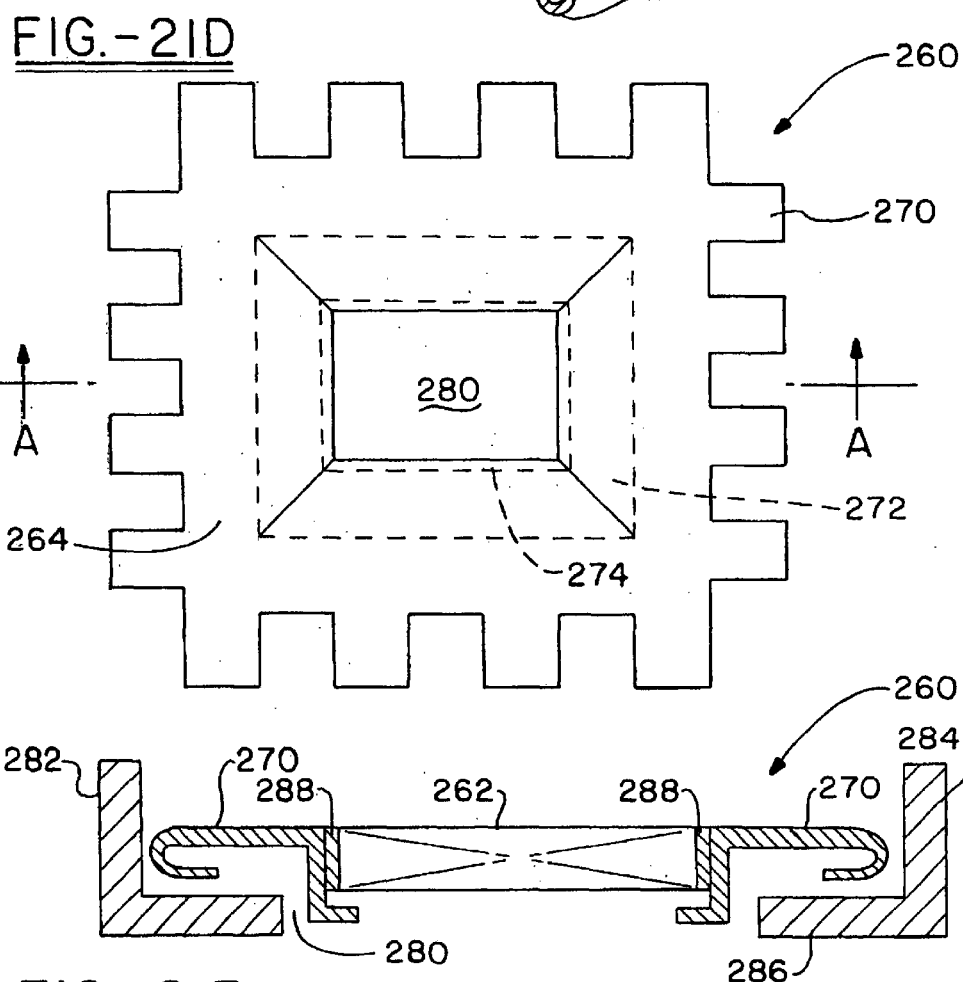
FIG. 21D is a top plan view of the strain relief carrier shown in FIG. 21A showing structural folding lines.

As described herein with relation to each of the differential and common mode filter carrier embodiments, the primary advantages are the additional physical strength the filter carriers provide to the differential and common mode filters and the increased shield and ground effects provided by the enlarged conductive surface areas coupled to the differential and common mode filters. FIGS. 21A–21E show strain relief carrier 260 which provides these benefits to differential and common mode filters configured with wire leads 266 as opposed to the various surface mount embodiments. Strain relief carrier 260 is comprised of a conductive material such a metal which is fabricated to create carrier frame 264. With reference to FIGS. 21B and 21C, strain relief carrier 260 includes a horizontal component ledge 274 extending inward from vertical wall 272 which completely surrounds and receives differential and common mode filter 262. Extending from the upper end of vertical wall 272 is member 270 which extends outward to bend 276 with the remainder 278 of member 270 then directed back toward filter 262. In the preferred embodiment, disclosed in FIG.

Figure 21E:
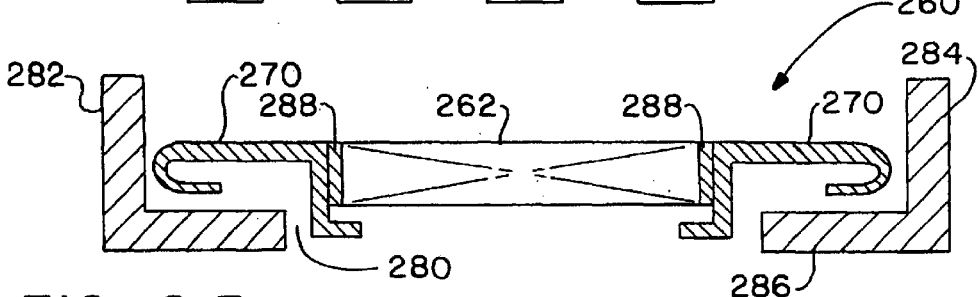
FIG. 21E is a side elevational view in cross section of the strain relief carrier shown in FIG. 21D along lines A—A which include a bracket for receiving the strain relief carrier and differential and common mode filter mounted within the strain relief carrier.

21D, strain relief carrier 260 is formed of a single conductive material in which extended members 270, vertical walls 272 and component ledge 274 are formed through predetermined bends along the dashed lines. The overall metal carrier frame 264 provides differential and common mode filter 262 with the additional physical strength and support that prevents filter 262 from being damaged in use. In addition, because strain relief carrier 260 is formed of a conductive material it provides increased ground surface area to filter 262 when it comes in contact with conductive ground surface 288 of filter 262. For use with electronic circuits strain relief carrier 260 may then be received by socket 282 comprised of ledge 286 and vertical member 284 fully surrounding the periphery of strain relief carrier 260 as shown in FIG. 21E.

Another embodiment of the present invention is disclosed in FIGS. 22A–22D as ground strap carrier 290. Referring to FIG. 22A ground strap carrier 290 is formed from a single piece of conductive material, such a metal, to form a resistive fit receptacle for surface mount differential and common mode filter 12 and a hook for mounting ground strap carrier 290 to electrical motor housing 304, as shown in FIG. 23. Ground strap carrier 290 is formed from a single piece of conductive material into two inverted and opposing U-shapes. Differential and common mode filter 12 is received and maintained upon base 292 and between inner protuberance 294 and outer protuberance 296 which provide a tight, resistive fitting for filter 12. The resistive fitting also forces electrical contact between base 292 and common ground conductive bands 26 of filter 12 as shown in FIG. 22B. Referring to FIG. 23, ground strap carrier 290 and differential and common mode filter 12 are coupled to electric motor housing 304 by hook 308. Hook 308 is comprised of vertical member 298, top 300 and vertical member 302 as shown in FIGS. 22A and 22B. Because ground strap carrier 290 is formed of a conductive material, when it is coupled to an electrical motor, the conductive motor housing 304 provides an enhanced shielding and ground surface area for differential and common mode filter 12 which enhances its shielding and electrical characteristics. Referring to FIG. 23, the first and second differential electrode bands 28 and 30 of differential and common mode filter 12 are electrically connected to the motor through spring retention conductors 306 formed within the motor and weaved around motor components 310. FIGS. 22C and 22D disclose an alternate embodiment of ground strap carrier 290 in which base 292 is elongated such that filter 12 can be accepted within carrier 290 in a flat orientation. The flat orientation allows both common ground conductive bands 26 of filter 12 to come in contact with protuberances 294 and 296. Ground strap carrier 290 provides a means for coupling surface mount differential and common mode filters within electric motors despite the small size and fragile nature of surface mount differential and common mode filters.

Figure 24A:
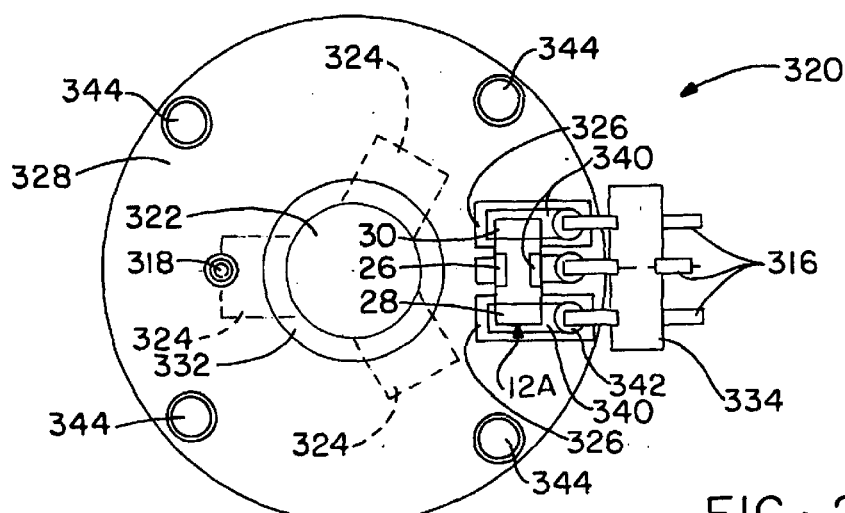
FIG. 24A is a top plan view of a motor filter carrier of the present invention.
Figure 24B:
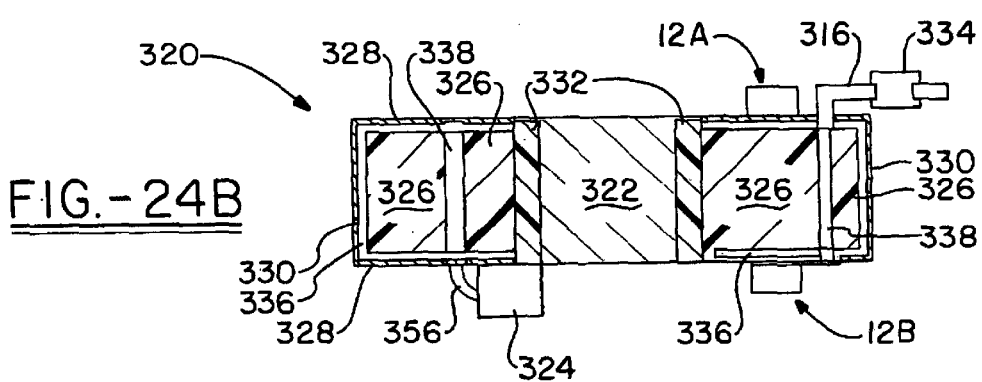
FIG. 24B is a side elevational view in cross section of the motor filter carrier shown in FIG. 24A.
Figure 24C:
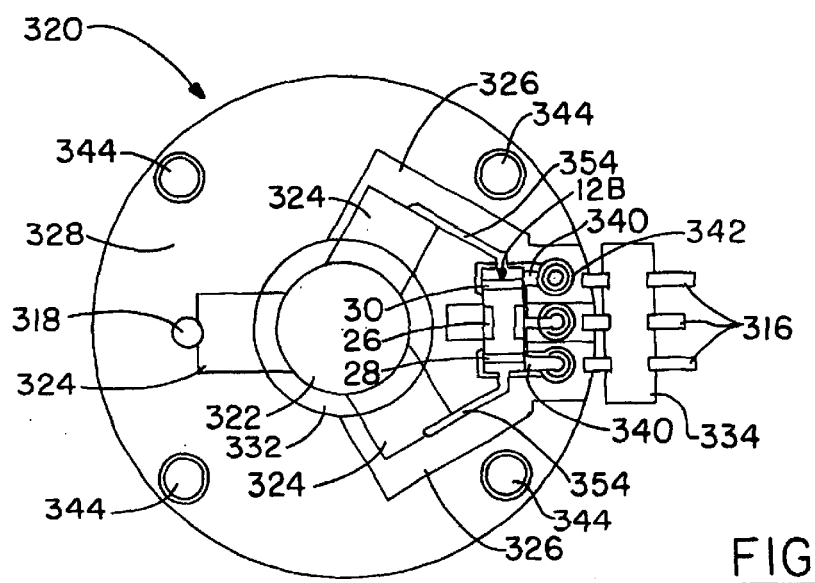
FIG. 24C is a bottom plan view of the motor filter carrier shown in FIGS. 24A and 24B.

FIGS. 24A–24C show a further embodiment of the present invention as motor filter carrier 320. As in previous embodiments, motor filter carrier 320 is constructed on a base of insulating material 326, as shown in FIG. 24B, which can be formed into any shape but in the preferred embodiment is circular to match the shape of most electric motors. Motor filter carrier 320 includes conductive surface 328 which covers most of the top and bottom surfaces of motor filter carrier 320. Electrically coupling the top and bottom conductive surfaces 328 is peripheral conductive surface 330 which surrounds the sides of motor filter carrier 320 to substantially cover the outer surfaces of motor filter carrier 320 with a conductive ground surface. Disposed through the center of motor filter carrier 320 is aperture 322 which receives a rotor (not shown) of an electric motor. Surrounding aperture 322 is insulation 332 which prevents electrical connection between motor filter carrier 320 and the rotor of the electric motor. Motor filter carrier 320 also includes a plurality of mounting apertures 344 which receive mounting hardware, such as screws, used to physically connect motor filter carrier 320 onto an electric motor.

Referring to FIG. 24A, motor filter carrier 320 includes three conductive apertures 342 which receive corresponding pins 316 from electrical connector 334. Attached and electrically coupled to each pad 342 is a conductive track 340 which extends from pad 342 towards the center of motor filter carrier 320. The three conductive tracks 340 are arranged in parallel to receive surface mount differential and common mode filter 12A. The two outer conductive tracks 340 have insulating material 326 surrounding the conductive track 340 in order to isolate the first and second differential electrode bands 28 and 30 of filter 12A from everything except their associated conductive tracks 340. The center conductive track 340 is electrically coupled to conductive surface 328 of motor filter carrier 320 which, in turn, electrically couples common ground conductive bands 26 of filter 12A to conductive surface 328 of motor filter carrier 320. Through this arrangement surface mount differential and common mode filter 12A is physically mounted to the top surface of motor filter carrier 320 with each of its bands electrically connected to each of the conductors 316 of electrical connector 334. The center pin 316 of electrical connector 334 is electrically coupled to the top and bottom surfaces by feed-thru aperture 338 which is plated with a conductive surface or through EL direct connection using a metal lead (not shown).

Referring to FIG. 24C, the bottom surface of motor filter carrier 320 includes a similar arrangement of conductive tracks 340 and conductive pads 342 which receive a second surface mount differential and common mode filter 12B. Differential and common mode filters 12A and 12B are electrically connected in parallel by a plurality of feed-thru apertures 338 shown in FIG. 24B or by connector pins directly. Each of the connector pins 316 of electrical connector 334 are disposed within feed-thru apertures 338 and electrically connected to a conductive pad 342 on both the top and bottom surfaces of motor filter carrier 320. The described arrangement allows parallel coupling of surface mount differential and common mode filters 12A and 12B which allows both low and high frequency filters to be combined in parallel to electrically condition an electrical motor coupled to motor filter carrier 320. The bottom surface of motor filter carrier 320, shown in FIG. 24C, differs from the top surface in that it includes an enlarged portion of insulating material 326 which electrically isolates two of the three electrical motor brushes 324 from conductive surface 328. The embodiment of the present invention disclosed in FIGS. 24A–24C is configured for use with a three brush electric motor with motor filter carrier 320 replacing a conventional cover of an electric motor. The three brushes 324 come in contact with the bottom surface of motor filter carrier 320 when carrier 320 is coupled to an electrical motor (not shown). As the three brushes 324 are the portions of the electric motor to receive the differential and common mode filter, the bottom surface of motor filter carrier 320 provides electrical coupling to surface mount differential and common mode filters 12A and 12B. One of three brushes 324 is electrically coupled to conductive surface 328 by flexible wire braid 356 connected to feed-thru brush aperture 318 and the nearest associated electrical motor brush 324. To electrically connect the remaining two brushes 324 to the first and second differential electrode bands 28 and 30 of filters 12A and 12B, brush contacts 354 comprised of conductive tracks extending from conductive tracks 340 come into physical contact with their respective brushes 324.

Motor filter carrier 320 when coupled with one or more differential and common mode filters 12A and/or 12B prevents electric fields generated within the motor, both low and high frequency, from coupling to wires, leads or traces which act as an antennas dispersing electrical noise throughout an electrical system. The present invention replaces known technology which required multiple capacitors, inductors and related circuits in addition to a shield or a protective shell enclosing the motor. Motor filter carrier 320 is particularly advantageous because many smaller electric motors have a plastic or nonmetallic top which allows electrical noise generated within the motor housing to escape or be transmitted out of the motor where it can interfere with other electrical systems. When motor filter carrier 320, in conjunction with one or more differential and common mode filters 12, is connected to a conductive enclosure of an electric motor the combination prevents internally generated electrical noise from escaping. The stray electrical noise is then disposed of by shunting the noise to the conductive motor housing ground connection. The present invention provides a low cost, simple assembly which requires less volume and provides for high temperature EMI performance in one package.

FIGS. 25A–25D show a further alternate embodiment of the present invention as motor filter carrier 350. The primary differences of the present embodiment to that disclosed in FIG. 24 is that the top and bottom surfaces of motor filter carrier 350 are comprised of insulating material 326 as opposed to a conductive surface. The top surface of motor filter carrier 350, shown in FIG. 25C, is essentially identical to the top surface described with respect to FIG. 24A except that most of the top surface is comprised of insulating material 326. The bottom surface of motor filter carrier 350, shown in FIG. 25A, is also substantially similar to the bottom surface described with respect to FIG. 24C except that most of the bottom surface is comprised of insulating material 326. There are also several other differences which will now be described. Referring to FIG. 25A, the bottom surface includes two conductive tracks 340 which are electrically coupled to conductors 316 of electrical connector 334. Electrically coupling each conductive track 340 to its respective electric motor brush 324 are flexible wire braids 348. In order to achieve the improved shielding and ground benefits, motor filter carrier 350 includes conductive core 346 spanning the circular area of motor filter carrier 350 while being embedded within top and bottom layers of insulating material 326. Referring to FIG. 25B, each of the plurality of mounting apertures 344 include conductive surfaces 352 which are electrically coupled to conductive core 346. When motor filter carrier 350 is placed over one end of an electric motor (not shown) with the rotor being disposed within aperture 322, the electrical coupling of the conductive housing of the electric motor with conductive core 346 of motor filter carrier 350 is achieved through the use of conductive mounting hardware such as metal screws. The conductive hardware is used to complete an electric circuit or loop between the motor housing mounting apertures 344 and conductive core 346. It can be seen from FIG. 25D that middle conductive pin 316 of connector 334 only extends within motor filter carrier 350 until it comes in contact with conductive core 346 providing electrical coupling between conductive core 346 and common ground conductive bands 26 of surface mount differential and common mode filter 12. Shown in FIG. 25B, the remaining conductive pins 316 attached to electrical connector 334 extend through the entire width of motor filter carrier 350 to electrically couple first and second differential electrode bands 28 and 30 to their respective electrical motor brushes 324 using flexible wire braids 348. Although this particular embodiment does not disclose the use of a second surface mount differential and common mode filter connected to the bottom of motor filter carrier 350, such an alternate embodiment is contemplated by applicant. For the same reasons applicant also contemplates motor filter carrier 320 shown in FIGS. 24A–24C only having a single differential and common mode filter.

Figure 26A:
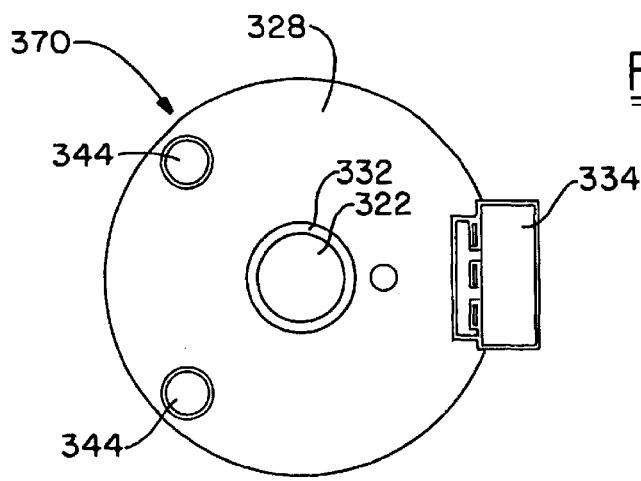
FIG. 26A is a top plan view of an alternate embodiment of the motor filter carrier of the present invention comprised of multiple layers.
Figure 26B:
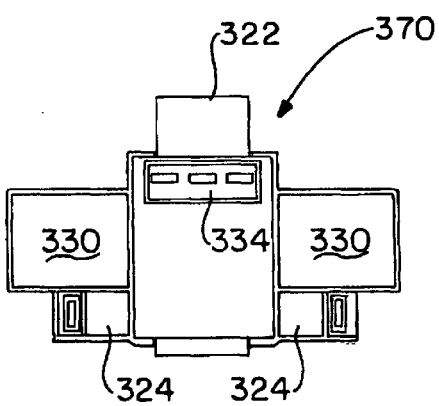
FIG. 26B is a side elevational view of the motor filter carrier shown in FIG. 26A.
Figure 26C:
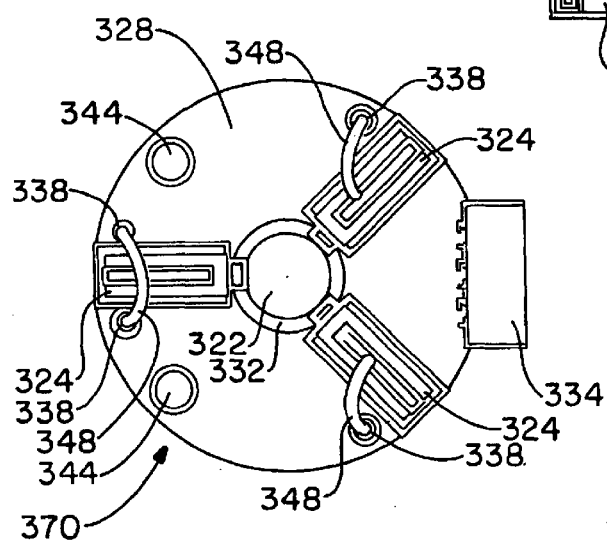
FIG. 26C is a bottom plan view of the motor filter carrier shown in FIG. 26A.
Figure 26D:
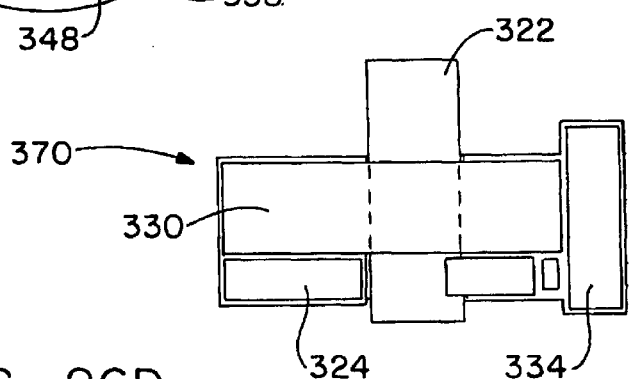
FIG. 26D is a side elevational view in cross section of the motor filter carrier shown in FIG. 26C along lines B—B.
Figure 26E:
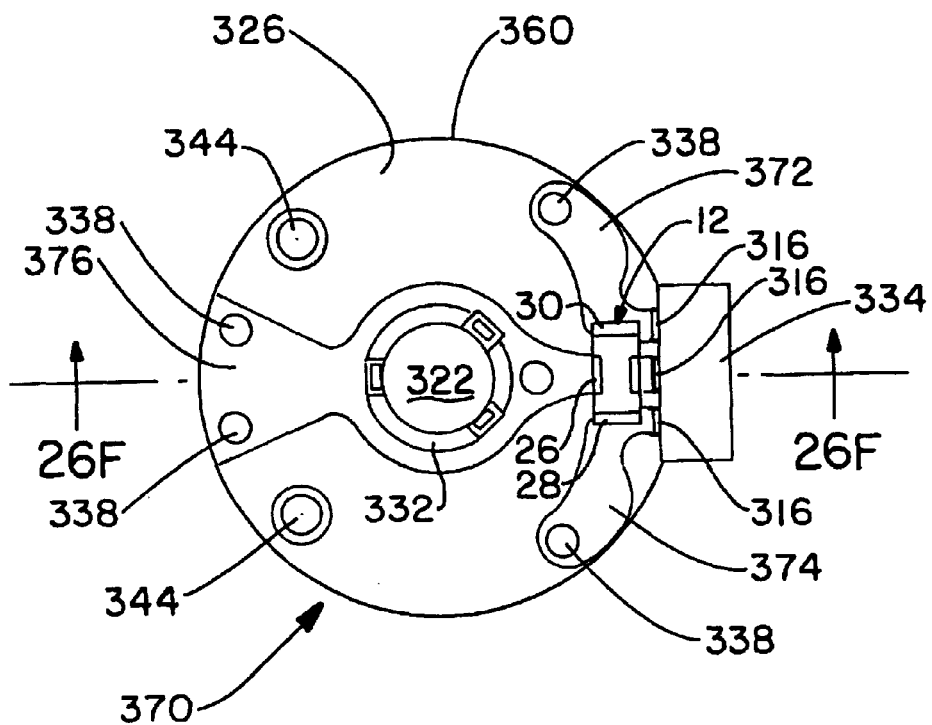
FIG. 26E is a top plan view of an intermediate layer of the motor filter carrier shown in FIG. 26A.
Figure 26F:
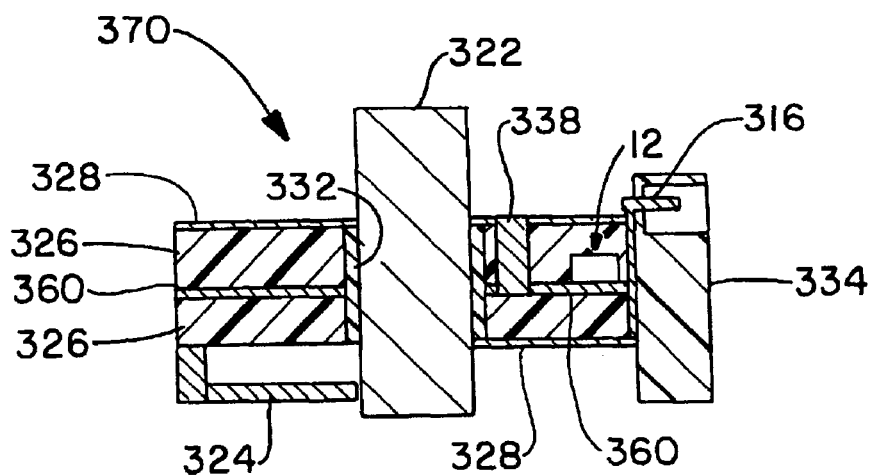
FIG. 26F is a side elevational view in cross section of the motor filter carrier shown in FIG. 26E along lines C—C.
Figure 27A:
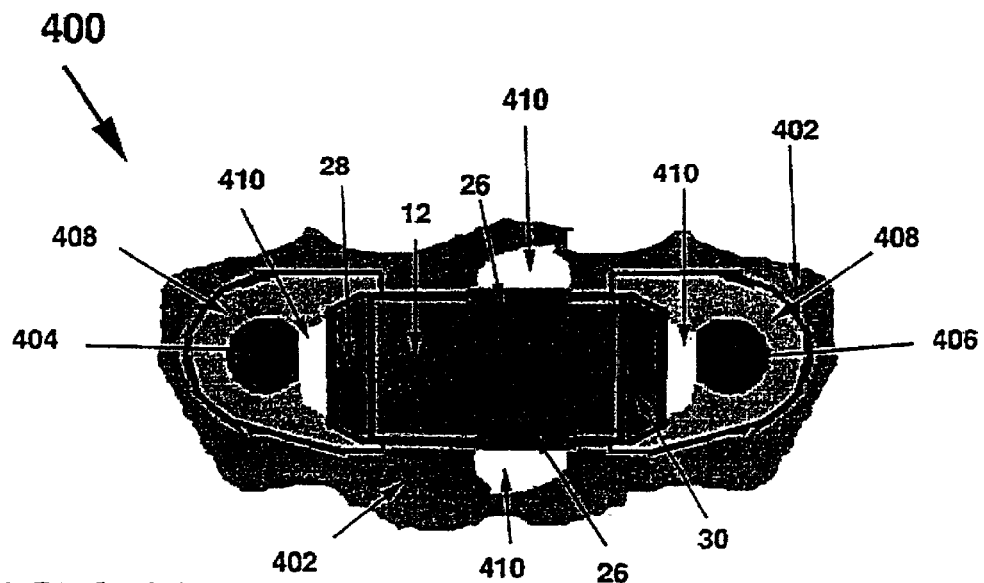
FIG. 27A is a top plan view of a carrier electrical circuit conditioning assembly of the present invention.
Figure 27B:
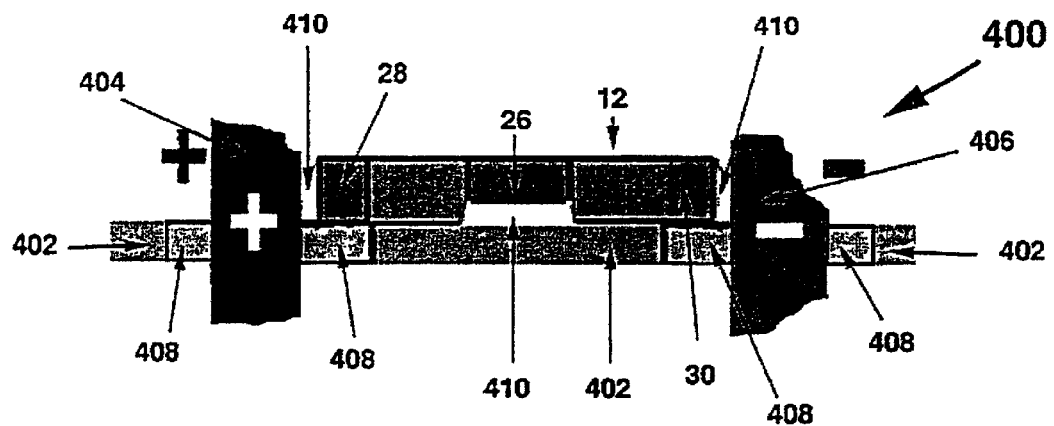
FIG. 27B is a side elevational view of the carrier electrical circuit conditioning assembly shown in FIG. 27A.

A third alternate embodiment of the motor filter carriers of the present invention is disclosed in FIGS. 26A–26F as motor filter carrier 370. This embodiment provides the added benefit of having surface mount differential and common mode filter 12 embedded within motor filter carrier 370 thus providing a single component for use in providing differential and common mode filtering and ground shielding to electric motors. As in previous embodiments, motor filter carrier 370 includes an electrical connector 334 coupled to the top surface of motor filter carrier 370 with the top surface covered by conductive surface 328. Motor filter carrier 370 also includes a plurality of mounting apertures 344 and aperture 322 disposed through motor filter carrier 370. Aperture 322 is electrically isolated from conductive surface 328 by insulation 322. The bottom surface of motor filter carrier 370, as shown in FIG. 26C, is also covered by conductive surface 328 which is electrically connected to conductive surface 328 on the top of motor filter carrier 370 by peripheral conductive surface 330 surrounding the sides of motor filter carrier 370. As in the previous embodiments, electric motor brushes 324 come in connect with the bottom surface of motor filter carrier 370 and are electrically coupled to surface mount differential and common mode filter 12 by flexible wire braids 348. The central difference of the present embodiment is the inclusion of internal layer 360 to which surface mount differential and common mode filter 12 is physically coupled. Internal layer 360 is comprised of insulating material 326 and includes a plurality of conductive tracks deposited on the surface of internal layer 360 used to electrically couple the various bands of differential and common mode filter 12 to electric motor brushes 324. Referred to FIG. 26E, internal layer 360 includes first conductive track 372, second conductive track 374 and ground conductive track 376. Each conductive track is electrically coupled to one of the conductive pins 316 extending from electrical connector 334. Surface mount differential and common mode filter 12 is placed on top of internal layer 360 in a predetermined position such that conductive track 372 is electrically coupled to second differential electrode band 30 and conductive track 374 is electrically connected to first differential electrode band 28. Conductive track 376 comes in contact with and is electrically coupled to common ground conductive bands 26 of filter 12. Each of the conductive tracks, 372, 374 and 376, come in contact with and surround one or more feed-thru apertures 338 which provide electrical coupling to the plurality of brushes 324. Each of the feed-thru apertures 338 are covered with a conductive surface so flexible wire braid 348 connects brushes 324 to filter 12 when soldered within feed-thru apertures 338. Although not shown, the present embodiment could be combined with the previous motor filter carrier embodiments in any number of combinations including having surface mount differential and common mode filters coupled to an internal layer and both top and bottom surfaces thereby providing even more versatility and filtering capability FIGS. 27A and 27B show the carrier electrical circuit conditioning assembly 400 which resulted from the combination of the previously described component carriers with the differential and common mode filter 12. Shown in FIG. 27A, differential and common mode filter 12 is placed upon conductive ground surface 402 making physical contact between conductive ground surface 402 and common ground conductive electrode bands 26. First and second differential conductive bands 30 and 28 are placed upon insulation pads 408 with differential signal conductors 404 and 406 disposed through each insulation pad 408. First differential electrode band 28 and first differential signal conductor 404 are then further coupled physically and electrically to each other through a well known means in the art such as solder 410. In addition, second differential electrode band 30 and second differential signal conductor 406 are coupled physically and electrically to one another and common ground conductive electrode bands 26 are coupled physically and electrically to ground area 402.

The internal construction of differential and common mode filter 12 electrically isolates differential signal conductor 404 and first differential electrode band 28 from second differential signal conductor 406 and second differential electrode band 30. The internal construction of the differential and common mode filter 12 creates a capacitive element coupled between the first and second differential signal conductors 404 and 406 and creates two capacitive elements, one coupled between the first differential signal conductor 404 and the common conductive ground surface 402 and the other coupled between the other second differential signal conductor 406 and the common conductive ground surface 402. While this arrangement of line-to-line and line-to-ground filtering is occurring the first and second differential signal conductors 404 and 406 remain electrically isolated from one another. From FIG. 27B it can be seen that first and second differential electrode bands 28 and 30 are prevented from coming into direct physical contact with conductive ground surface 402 due to insulating pads 408 interposed between differential signal conductors 404 and 406 and the conductive ground surface 402.

The combination of the differential and common mode filter 12 with its capacitive elements coupled line-to-line between differential signal conductors 404 and 406 and line-to-ground between the differential signal conductors 404 and 406 and conductive ground surface 402 provides substantial attenuation and filtering of differential and common mode electrical noise. At the sane time the combination also performs simultaneous differential line decoupling. Another benefit provided by the combination include mutual cancellation of magnetic fields generated between differential signal conductors 404 and 406. By connecting the common ground conductive electrode bands 26 to a large conductive ground surface 402, increased shielding of the ground plane is provided to differential and common mode filter 12 which further enhances the desired functional characteristics of differential and common mode filter 12.

The combination of the differential and common mode filter 12 with the internal partial Faraday-like shields electrically connected to conductive ground surface 402 cause noise and coupling currents from different elements of carrier electrical circuit conditioning assembly 400 to be contained at their source or to conductive ground surface 402 without affecting differential signal conductors 404 and 406 or other elements of carrier electrical circuit conditioning assembly 400 when differential and common mode filter 12 is attached between differential signal conductors 404 and 406. Carrier electrical circuit conditioning assembly 400 reduces, and in some cases eliminates, forms of capacitor parasitics and stray capacitance between differential signal conductors 404 and 406. Differential and common mode filter 12 provides these benefits due to its internal, partial Faraday-like shields that almost envelope the internal differential electrodes of differential and common mode filter 12 which connect to ground conductive electrode bands 26. These benefits are significantly increased when the partial Faraday-like shields are electrically connected by ground conductive electrode bands 26 to conductive ground surface 402.

Figure 28A:
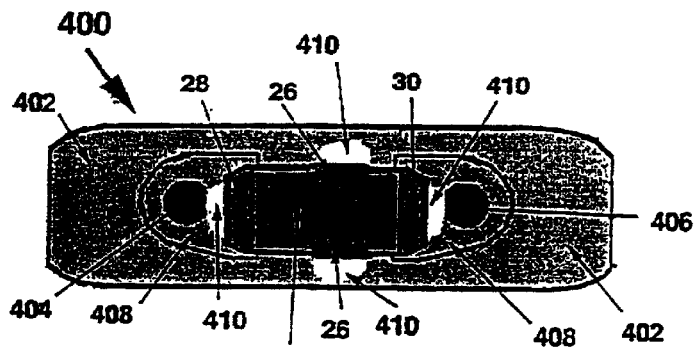
FIG. 28A is a top plan view of a carrier electrical circuit conditioning assembly applied to a crystal base portion of a crystal component.
Figures 28B, 28C, 28D:
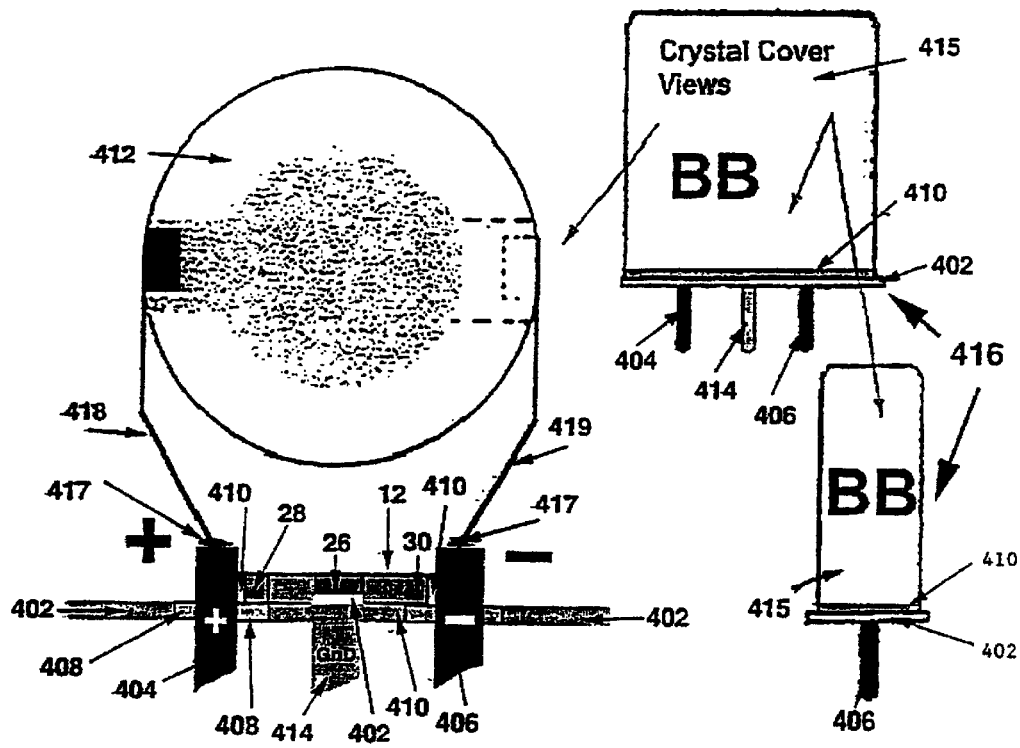
FIG. 28B is a side elevational view of the carrier electrical circuit conditioning assembly applied to a crystal base portion of a crystal component shown in FIG. 28A.
FIG. 28C is a front elevational view of the carrier electrical circuit conditioning assembly enclosed in a crystal component application shown in FIG. 28B with a metal enclosure.
FIG. 28D is a side elevational view of the carrier electrical circuit conditioning assembly enclosed in a crystal component application shown in FIG. 28C.

FIGS. 28A–28D show one application of carrier electrical circuit conditioning assembly 400 used in conjunction with a crystal. Referring to FIG. 28B, differential and common mode filter 12 is physically and electrically coupled between first and second differential signal conductors 404 and 406 and to ground conductive surface 402. In this particular application ground conductive surface 402 is comprised of the metal base of the crystal, which in turn is connected to a metal cover 415 shown in FIGS. 28C and 28D. First and second differential signal conductors 404 and 406 of carrier electrical circuit conditioning assembly 400 are electrically isolated from ground conductive surface 402 by insulation pads 408. Common ground conductive electrode bands 26 are electrically connected to ground conductive surface 402 using solder 410 or other similar means. A ground conductor pin 414 is also attached or molded monolithically to conductive ground surface 402 by soldering, welding or casting. Ground conductor pin 414 allows for further connection of crystal component application 416 to a system ground (not shown). The internal construction of the differential and common mode filter 12 creates a capacitive element coupled between the first and second differential signal conductors 404 and 406 and creates two capacitive elements, one coupled between the first differential signal conductor 404 and ground conductive surface 402 and the other coupled between the other second differential signal conductor 406 and ground conductive surface 402. While this arrangement of line-to-line and line-to-ground filtering is occurring the first and second differential signal conductors 404 and 406 remain electrically isolated from one another. From FIG. 28B it can be seen that first and second differential electrode bands 28 and 30 are prevented from coming into direct physical contact with ground conductive surface 402 due to insulating pads 408 interposed between differential signal conductors 404 and 406 and the ground conductive surface 402.

FIGS. 28C and 28D show the final combination of crystal component assembly 416 and its metal housing 415 which provides an additional ground shield for the combination. The carrier electrical circuit conditioning assembly 400 shown in crystal component assembly 416 simultaneously filters and attenuates common mode and differential mode electrical noise attributed to such circuitry including such noise found between differential electrical line conductors 404 and 406. Crystal component assembly 416 can also substantially reduce and in some cases eliminate or prevent differential current flow, mutual inductive coupling such as cross talk and ground bounce between either differential electrical line conductor 404 and 406. The carrier electrical circuit conditioning assembly 400 also simultaneously provides mutual cancellation of opposing magnetic fields attributed to and existing between differential electrical line conductors 404 and 406. In addition, carrier electrical circuit conditioning assembly 400 complements the inherent, internal ground structure and internal shield structures that nearly envelope or surround each opposing electrode within differential and common mode filter 12 to substantially improve overall noise attenuation on differential signal conductors 404 and 406 that would otherwise affect and degrade the desired performance of crystal component application 416. The essential elements of carrier electrical circuit conditioning assembly 400 consist of differential and common mode filter and decoupler 12 as defined herein with a capacitive element coupled between the first and second differential signal conductors 404 and 406 and two capacitive elements, one coupled between the first differential signal conductor 404 and ground conductive surface 402 and the other coupled between the other second differential signal conductor 406 and ground conductive surface 402 while maintaining electrical isolation between the first and second differential signal conductors 404 and 406; at least two energized differential electrical line conductors; and a physical and electrical coupling of common ground conductive electrode bands 26 of differential and common mode filter 12 to ground conductive surface 402. The various elements listed that make up carrier electrical circuit conditioning assembly 400 are interconnected using solder 410, conductive epoxy 417 or other means well known in the art.

Although the principles, preferred embodiments and preferred operation of the present invention have been described in detail herein, this is not to be construed as being limited to the particular illustrative forms disclosed. They will thus become apparent to those skilled in the art that various modifications of the preferred embodiments herein can be made without departing from the spirit or scope of the invention as defined by the appended claims.

What is claimed is:

1. A carrier electrical circuit conditioning assembly comprising:
    at least one differential and common mode filter having at least a first and second differential electrode band and at least one common ground conductive band;
    a conductive ground surface electrically connected to said at least one common ground conductive band; and
    at least two signal conductors electrically connected between said first and second differential electrode bands with both of said at least two signal conductors electrically isolated from one another and from said common ground conductive band;
    wherein said at least one differential and common mode filter provides at least one capacitive element electrically connected between said at least two signal conductors;
    wherein said at least one differential and common mode filter provides at least two capacitive elements, one electrically connected between said first signal conductor and said ground conductive surface and the other electrically connected between said second signal conductor and said ground conductive surface; and
    wherein said at least one differential and common mode filter provides electrical isolation between said at least two signal conductors.

2. A carrier electrical circuit conditioning assembly as recited in claim 1, wherein said conductive ground surface in combination with said differential and common mode filter minimizes the effects of stray capacitance thereby decreasing the level of electrical noise coupled onto said at least two signal conductors.

3. A carrier electrical circuit conditioning assembly as recited in claim 1, wherein said conductive ground surface in combination with said differential and common mode filter increases the attenuation and filtering provided by said at least one differential and common mode filter.

4. A carrier electrical circuit conditioning assembly as recited in claim 1, wherein said conductive ground surface in combination with said differential and common mode filter increases decoupling efficiency to said signal conductors provided by said at least one differential and common mode filter thereby reducing the level of switching noise coupled onto said at least two signal conductors.

5. A carrier electrical circuit conditioning assembly as recited in claim 1, wherein said conductive ground surface in combination with said differential and common mode filter increases the mutual cancellation of magnetic fields generated between said at least two signal conductors.

6. A carrier electrical circuit conditioning assembly as recited in claim 1, wherein said conductive ground surface in combination with said differential and common mode filter decreases the level of mutual inductive coupling between said at least two signal conductors.

7. A carrier electrical circuit conditioning assembly as recited in claim 1, wherein said conductive ground surface in combination with said differential and common mode filter minimizes the effects of cross talk between said at least two signal conductors.

8. A carrier electrical circuit conditioning assembly as recited in claim 1, wherein said conductive ground surface in combination with said differential and common mode filter minimizes the effects of ground return loops coupled onto said at least two signal conductors.

9. A carrier for a surface mount differential and common mode filter, wherein said surface mount differential and common mode filter includes first and second electrode bands and at least one common ground conductive band, comprising:
    an planar insulator having at least two apertures disposed therein;
    a conductive ground surface partially spanning the area of said planar insulator;
    at least two conductive pads formed on a first side of said planar insulator, wherein each of said at least two apertures are surrounded by one of said at least two conductive pads; and
    at least two insulating bands disposed on said planar insulator, wherein each of said at least two conductive pads is electrically isolated from said conductive ground surface by one of said at least two insulating bands;
    wherein said surface mount differential and common mode filter is placed upon said carrier so that said first and second electrode bands are electrically connected to said at least two conductive pads and said common ground conductive band is electrically connected to said conductive ground surface.

10. A carrier for a surface mount differential and common mode filter as recited in claim 9, wherein the inner walls of each of said at least two apertures includes conductive plating which is electrically connected to said each of said corresponding at least two conductive pads.

11. A carrier for a surface mount differential and common mode filter as recited in claim 9, wherein said at least two apertures are adapted to receive electrical conductors disposed through said at least two apertures, wherein said conductive plating within said at least two apertures electrically connects said electrical conductors to said at least two conductive pads.

12. A carrier for a surface mount differential and common mode filter as recited in claim 9, wherein said conductive ground surface partially covers a first side of said planar insulator.

13. A carrier for a surface mount differential and common mode filter as recited in claim 12, wherein said conductive ground surface extends from said first side of said planar insulator onto the outer edge of said planar insulator.

14. A carrier for a surface mount differential and common mode filter as recited in claim 12, further comprising a conductive ground surface embedded within said planar insulator and electrically connected to said conductive ground surface partially covering said first side of said planar insulator.

15. A carrier for a surface mount differential and common mode filter as recited in claim 9, wherein said conductive ground surface partially covers a first and second side of said planar insulator.

16. A carrier for a surface mount differential and common mode filter as recited in claim 15, wherein said conductive ground surface extends from said first and second sides of said planar insulator onto the outer edge of said planar insulator.

17. A carrier for a surface mount differential and common mode filter as recited in claim 15, further comprising a conductive ground surface embedded within said planar insulator and electrically connected to said conductive ground surface partially covering said first and second sides of said planar insulator.

18. A carrier for a surface mount differential and common mode filter as recited in claim 9, wherein said conductive ground surface is embedded within said planar insulator.

19. A carrier for a surface mount differential and common mode filter as recited in claim 9, further comprising at least two conductive pads formed on a second side of said planar insulator to receive a second differential and common mode filter.

20. A carrier for a surface mount differential and common mode filter as recited in claim 19, wherein said at least two conductive pads are electrically connected to said conductive plating of said at least two apertures, thereby electrically connecting corresponding conductive pads on said first and second sides of said planar insulator.

21. A carrier for a surface mount differential and common mode filter as recited in claim 9, wherein said surface mount differential and common mode filter is configured with multiple first and second electrode bands and multiple common ground conductive bands, further comprising:
   conductive traces disposed on said first side of said planar insulator and extending from said conductive pads in a predetermined pattern to electrically connect to said corresponding multiple first and second electrode bands; and
   wherein said conductive ground surface partially covers said first side of said planar insulator in a predetermined pattern to electrically connect to said corresponding multiple common ground conductive bands.

22. A carrier for a surface mount differential and common mode filter as recited in claim 21, wherein said carrier includes conductive traces disposed on said second side of said planar insulator in an similar arrangement to allow said carrier to receive at least two surface mount differential and common mode filters.

23. A carrier for a surface mount differential and common mode filter as recited in claim 9, wherein said carrier is configured to receive multiple surface mount differential and common mode filters, further comprising:
   conductive traces disposed on said first side of said planar insulator and extending from said conductive pads in a predetermined pattern to electrically connect to each of said first and second electrode bands of said multiple surface mount differential and common mode filters; and
   wherein said conductive ground surface partially covers said first side of said planar insulator in a predetermined pattern to electrically connect to each of said corresponding multiple common ground conductive bands of said multiple surface mount differential and common mode filters.

24. A carrier for a surface mount differential and common mode filter as recited in claim 23, wherein said carrier includes conductive traces disposed on said second side of said planar insulator in an similar arrangement to allow said carrier to receive at least two surface mount differential and common mode filters.

25. A thru-hole multi-conductor carrier for a plurality of surface mount differential and common mode filters, wherein each of said plurality of surface mount differential and common mode filters includes first and second electrode bands and at least one common ground conductive band, comprising:
   a planar insulator having a plurality of apertures disposed therein;
   a conductive ground surface partially spanning the area of said planar insulator;
   a plurality of conductive pads formed on a first side of said planar insulator, wherein each of said plurality of apertures is surrounded by one of said plurality of conductive pads;
   a plurality of insulating bands disposed on said planar insulator, wherein each of said plurality of conductive pads is electrically isolated from said conductive ground surface by one of said plurality of insulating bands; and
   a plurality of conductive vias formed on a first side of said planar insulator, wherein each of said plurality of conductive vias is electrically connected to said conductive ground surface;
   wherein said plurality of surface mount differential and common mode filters are placed upon said thru-hole multi-conductor carrier so that for each of said plurality of surface mount differential and common mode filters said first and second electrode bands of are electrically connected between at least two of said plurality of conductive pads and said common ground conductive band is electrically connected to said conductive ground surface.

26. A thru-hole multi-conductor carrier for a plurality of surface mount differential and common mode filters as recited in claim 25, wherein said conductive surface is embedded within said planar insulator.

27. A thru-hole multi-conductor carrier for a plurality of surface mount differential and common mode filters as recited in claim 26, further comprising a peripheral conductive surface disposed on the sides of said thru-hole multi-conductor carrier, wherein said peripheral conductive surface is electrically connected to said embedded conductive surface.

28. A thru-hole multi-conductor carrier for a differential and common mode strip filter, wherein said differential and common mode strip filter includes a plurality of first and second electrode bands and a plurality of common ground conductive bands, comprising:

a planar insulator having a plurality of apertures disposed therein;

a conductive ground surface partially spanning the area of said planar insulator;

a plurality of conductive feed-thru apertures formed on a first side of said planar insulator, wherein each of said plurality of conductive feed-thru apertures is electrically connected to a conductive track disposed on said first side of said planar insulator; and an insulating pattern disposed on said planar insulator, wherein each of said plurality of conductive feed-thru apertures and said conductive tracks are electrically isolated from one another and from said conductive ground surface; and a predetermined conductive track pattern which is disposed on a first side of said planar insulator with members extending towards the center of said planar insulator, wherein said predetermined conductive track pattern is electrically connected to said conductive ground surface;

wherein said differential and common mode strip filter is placed upon said thru-hole multi-conductor carrier so that each of said first and second electrode bands are electrically connected between at least two of said plurality of said feed-thru apertures through said associated conductive track and said common ground conductive bands are electrically connected to said extended members of said predetermined conductive track pattern.

29. A thru-hole multi-conductor carrier for a differential and common mode strip filter as recited in claim 28, wherein said conductive ground surface partially covers the top, bottom and sides of said planar insulator.

30. A thru-hole multi-conductor carrier for a differential and common mode strip filter as recited in claim 28, wherein said conductive ground surface is embedded within said planar insulator and electrically connected to said predetermined conductive track pattern through conductive vias.

31. A multi-component surface mount differential and common mode filter carrier, wherein each of said surface mount differential and common mode filters includes first and second electrode bands and at least one common ground conductive band, for connecting external circuitry to said plurality of surface mount differential and common mode filters comprising:

a planar insulator;

a conductive ground surface partially spanning the area of said planar insulator and disposed on a first side of said planar insulator;

a plurality of conductive surfaces disposed on said first side of said planar insulator having a plurality of apertures disposed therein; and a predetermined pattern of insulating material disposed on said first side of said planar insulator which electrically isolates each of said plurality of conductive surfaces from one another and from said conductive ground surface;

wherein said predetermined pattern of insulating material separates pairs of said plurality of conductive surfaces with a portion of said conductive ground surface disposed between said pairs of said conductive surfaces;

wherein each surface mount differential and common mode filter is placed upon said pair of said conductive surfaces so that said first electrode band is electrically connected to one of said pair of conductive surfaces, said second electrode band is electrically connected to the other of said pair of conductive surfaces and said common ground conductive band is electrically connected to said conductive ground surface; and wherein said external circuitry is electrically connected to said plurality of surface mount differential and common mode filters through said apertures disposed within each of said plurality of conductive surfaces.

32. A multi-component surface mount differential and common mode filter carrier as recited in claim 31, further comprising:

a conductive ground surface partially spanning the area of said planar insulator and disposed on a second side of said planar insulator;

a plurality of conductive surfaces disposed on said second side of said planar insulator having a plurality of apertures disposed therein; and a predetermined pattern of insulating material disposed on said second side of said planar insulator which electrically isolates each of said plurality of conductive surfaces from one another and from said conductive ground surface;

wherein said predetermined pattern of insulating material separates pairs of said plurality of conductive surfaces with a portion of said conductive ground surface disposed between said pairs of said conductive surfaces;

wherein each surface mount differential and common mode filter is placed upon said pair of said conductive surfaces so that said first electrode band is electrically connected to one of said pair of conductive surfaces, said second electrode band is electrically connected to the other of said pair of conductive surfaces and said common ground conductive band is electrically connected to said conductive ground surface; and wherein said external circuitry is electrically connected to said plurality of surface mount differential and common mode filters through said apertures disposed within each of said plurality of conductive surfaces.

33. A strain relief carrier for a differential and common mode filter, wherein said differential and common mode filter includes first and second electrodes and at least one common ground conductive electrode, comprising:

a rectangular conductive frame having a recessed ledge;

wherein said differential and common mode filter is received within said rectangular conductive frame and supported upon said recessed ledge; and wherein said at least one common ground conductive electrode of said differential and common mode filter electrically connects through physical contact with said rectangular conductive frame.

34. A strain relief carrier for a differential and common mode filter as recited in claim 33 wherein said rectangular conductive frame includes a plurality of outwardly extending members formed along all four sides of said rectangular conductive frame.

35. A strain relief carrier for a differential and common mode filter as recited in claim 34, further including a rectangular socket having a recessed ledge, wherein said rectangular socket receives said strain relief carrier and wherein said outwardly extending members of said rectangular conductive frame come in contact with said rectangular socket thereby maintaining said stain relief carrier and differential and common mode filter within said rectangular socket.

36. A ground strap carrier for a surface mount differential and common mode filter, wherein said surface mount differential and common mode filter includes first and second electrode bands and at least one common ground conductive band, used to mount said surface mount differential and common mode filter to the conductive housing of an electrical motor, comprising:
- a base having an upwardly extending outer protuberance and an upwardly extending inner protuberance;
- a vertical member extending upward from said inner protuberance;
- a top extending from the distal end of said vertical member, said top extending in a horizontal direction opposite the direction of said base; and
- a vertical member extending downward from the distal end of said top;
- wherein the upper portion of said upwardly extending vertical member, said top and said downwardly extending vertical member form an inverted U-shaped hook for hanging said ground strap carrier from said conductive housing of said electrical motor;
- wherein said base and said outer and inner protuberances form a U-shaped cradle for receiving said surface mount differential and common mode filter;
- wherein said outer and inner protuberances physically contact and provide electrical connection between said ground strap carrier and said at least one common ground conductive band.

37. A ground strap carrier for a surface mount differential and common mode filter as recited in claim 36 further comprising:
- at least two conductive springs electrically connected to brushes of said electrical motor wherein each of said at least two conductive springs comes in contact with and electrically connects to said first and second electrode bands in order to electrically connect said surface mount differential and common mode filter to said electrical motor.

38. A carrier for at least one surface mount differential and common mode filter, wherein said surface mount differential and common mode filter includes first and second electrode bands and at least one common ground conductive band, and wherein said carrier will be mounted to the top of a metal housing of an electrical motor with the rotor of said electrical motor passing through said carrier and the brushes of said electrical motor electrically connected to said first and second electrode bands and said at least one common ground conductive band, comprising:
- a planar insulator having an insulated aperture disposed within the center of said planar insulator for receiving said rotor,
- a conductive ground surface partially spanning a first side of said planar insulator;
- at least three conductive tracks formed in a predetermined pattern on said first side of said planar insulator each electrically isolated from one another by insulation material;
- wherein one of said at least three conductive tracks is electrically connected to said conductive ground surface; and
- wherein said surface mount differential and common mode filter is placed upon said predetermined pattern of said at least three conductive tracks so that said common ground conductive band is electrically connected to said one of said at least three conductive tracks electrically connected to said conductive ground surface and said first and second electrode bands are electrically connected to said two remaining conductive tracks.

39. A carrier for at least one surface mount differential and common mode filter as recited in claim 38, further comprising a three pin electrical connector physically attached to said carrier and having each of said three pins electrically connected to one of said at least three conductive tracks.

40. A carrier for at least one surface mount differential and common mode filter as recited in claim 39, wherein said brushes of said electrical motor are electrically connected to each of said at least three conductive tracks thereby electrically connecting each of said brushes to either said first and second electrode bands or said common ground conductive band of said surface mount differential and common mode filter.

41. A carrier for at least one surface mount differential and common mode filter as recited in claim 38, further comprising:
- a conductive ground surface partially spanning a second side of said planar insulator;
- at least three conductive tracks formed in a predetermined pattern on said second side of said planar insulator each electrically isolated from one another by insulation material;
- wherein one of said at least three conductive tracks is electrically connected to said conductive ground surface; and
- wherein said surface mount differential and common mode filter is placed upon said predetermined pattern of said at least three conductive tracks so that said common ground conductive band is electrically connected to said one of said at least three conductive tracks electrically connected to said conductive ground surface and said first and second electrode bands are electrically connected to said two remaining conductive tracks.

42. A carrier for at least one surface mount differential and common mode filter as recited in claim 41, wherein each of said three pins of said electrical connector are electrically connected to one of said at least three conductive tracks disposed on said second side of said planar insulator.

43. A carrier for at least one surface mount differential and common mode filter, wherein said surface mount differential and common mode filter includes first and second electrode bands and at least one common ground conductive band, and wherein said carrier will be mounted to the top of a metal housing of an electrical motor with the rotor of said electrical motor passing through said carrier and the brushes of said electrical motor electrically connected to said first and second electrode bands and said at least one common ground conductive band, comprising:
- a planar insulator having an insulated aperture disposed within the center of said planar insulator for receiving said rotor;
- a conductive ground surface embedded within and partially spanning the area of said planar insulator,
- at least three conductive tracks formed in a predetermined pattern on said first side of said planar insulator each electrically isolated from one another by insulation material;
- wherein one of said at least three conductive tracks is electrically connected to said conductive ground surface; and
- wherein said surface mount differential and common mode filter is placed upon said predetermined pattern of said at least three conductive tracks so that said common ground conductive band is electrically connected to said one of said at least three conductive tracks electrically connected to said conductive ground surface and said first and second electrode bands are electrically connected to said two remaining conductive tracks.

44. A carrier for at least one surface mount differential and common mode filter as recited in claim 43, further comprising a three pin electrical connector physically attached to said carrier and having each of said three pins electrically connected to one of said at least three conductive tracks.

45. A carrier for at least one surface mount differential and common mode filter as recited in claim 44, wherein said brushes of said electrical motor are electrically connected to each of said at least three conductive tracks thereby electrically connecting each of said brushes to either said first and second electrode bands or said common ground conductive band of said surface mount differential and common mode filter.

46. A carrier for at least one surface mount differential and common mode filter, wherein said surface mount differential and common mode filter includes first and second electrode bands and at least one common ground conductive band, and wherein said carrier will be mounted to the top of a metal housing of an electrical motor with the rotor of said electrical motor passing through said carrier and the brushes of said electrical motor electrically connected to said first and second electrode bands and said at least one common ground conductive band, comprising:

a planar insulator having an insulated aperture disposed within the center of said planar insulator for receiving said rotor;

a conductive ground surface partially spanning a first side of said planar insulator;

at least three conductive tracks formed in a predetermined pattern and embedded within said planar insulator each electrically isolated from one another by insulation material;

wherein one of said at least three conductive tracks is electrically connected to said conductive ground surface; and wherein said surface mount differential and common mode filter is placed upon said predetermined pattern of said at least three conductive tracks, and embedded within said planar insulator, so that said common ground conductive band is electrically connected to said one of said at least three conductive tracks electrically connected to said conductive ground surface and said first and second electrode bands are electrically connected to said two remaining conductive tracks.

47. A carrier for at least one surface mount differential and common mode filter as recited in claim 46, further comprising a three pin electrical connector physically attached said carrier and having each of said three pins electrically connected to one of said at least three conductive tracks.

48. A carrier for at least one surface mount differential and common mode filter as recited in claim 47, wherein said brushes of said electrical motor are electrically connected to each of said at least three conductive tracks thereby electrically connecting each of said brushes to either said first and second electrode bands or said common ground conductive band of said surface mount differential and common mode filter.

* * * * *

UNITED STATES PATENT AND TRADEMARK OFFICE
CERTIFICATE OF CORRECTION

| | | |
|---|---|---|
| PATENT NO. | : 6,995,983 B1 | Page 1 of 1 |
| APPLICATION NO. | : 09/647648 | |
| DATED | : February 7, 2006 | |
| INVENTOR(S) | : Anthony Anthony et al. | |

It is certified that error appears in the above-identified patent and that said Letters Patent is hereby corrected as shown below:

Column 1,
Lines 4-14, replace:
"This application is a national stage application of international application PCT/US99/07653 filed Apr. 6, 1999. This application is a continuation-in-part of application Ser. No. 09/056,436 filed Apr. 7, 1998, now abandoned, which is a continuation-in-part of U.S. application Ser. No. 09/008,769 filed Jan. 19, 1998, now U.S. Pat. No. 6,097,581 which is a continuation-in-part of U.S. application Ser. No. 08/841,940, filed Apr. 8, 1997, now U.S. Pat. No. 5,909,305. This application also claims the benefit of U.S. Provisional Application No. 60/101,511 filed Sep. 23, 1998 and U.S. Provisional Application No. 60/103,759 filed Oct. 9, 1998."
with the following:
-- This application is a national stage application of international application PCT/US99/07653 filed Apr. 6, 1999; this application is also a continuation-in-part of application Ser. No. 09/056,436 filed Apr. 7, 1998, now abandoned, which is a continuation-in-part of U.S. application Ser. No.09/008,769 filed Jan. 19, 1998, now U.S. Pat. No. 6,097,581 which is a continuation-in-part of U.S. application Ser. No. 08/841,940, filed Apr. 8, 1997, now U.S. Pat No. 5,909,305; this application also claims priority to U.S. Provisional Application No. 60/101,511 filed Sep. 23, 1998 and U.S. Provisional Application No. 60/103,759 filed Oct. 9, 1998. --.

Signed and Sealed this

Twenty-fifth Day of July, 2006

JON W. DUDAS
*Director of the United States Patent and Trademark Office*